United States Patent
Gunn et al.

(10) Patent No.: US 7,260,279 B2
(45) Date of Patent: Aug. 21, 2007

(54) INTEGRATED OPTO-ELECTRONIC OSCILLATORS

(75) Inventors: Deana Gunn, Encinitas, CA (US); Nikolai Morozov, Valley Village, CA (US); Vladimir Ilchenko, Arcadia, CA (US); Dmitri A. Kossakovski, S. Pasadena, CA (US); Mark Henderson, La Verne, CA (US)

(73) Assignee: OEwaves, Inc., Pasadena, CA (US)

( * ) Notice: Subject to any disclaimer, the term of this patent is extended or adjusted under 35 U.S.C. 154(b) by 97 days.

(21) Appl. No.: 11/148,975

(22) Filed: Jun. 8, 2005

(65) Prior Publication Data
US 2005/0286602 A1 Dec. 29, 2005

Related U.S. Application Data

(60) Provisional application No. 60/578,565, filed on Jun. 9, 2004.

(51) Int. Cl.
*G02F 1/035* (2006.01)
*H01S 3/13* (2006.01)

(52) U.S. Cl. .............. 385/2; 385/14; 385/37; 372/32; 372/18

(58) Field of Classification Search ............... 385/1–3, 385/14, 27–31, 37; 372/18, 22, 28, 32, 50
See application file for complete search history.

(56) References Cited

U.S. PATENT DOCUMENTS

| | | | |
|---|---|---|---|
| 5,204,640 A | 4/1993 | Logan | 331/9 |
| 5,220,292 A | 6/1993 | Bianchini et al. | 331/16 |
| 5,723,856 A | 3/1998 | Yao et al. | 250/227.11 |
| 5,751,747 A | 5/1998 | Lutes et al. | 372/20 |
| 5,777,778 A | 7/1998 | Yao | 359/245 |
| 5,917,179 A | 6/1999 | Yao | 250/227.11 |
| 5,929,430 A | 7/1999 | Yao et al. | 250/205 |
| 5,985,166 A | 11/1999 | Unger et al. | 216/97 |
| 6,080,586 A | 6/2000 | Baldeschwieler et al. | 436/173 |
| 6,178,036 B1 | 1/2001 | Yao | 359/334 |
| 6,203,660 B1 | 3/2001 | Unger et al. | 156/345 |
| 6,389,197 B1 | 5/2002 | Iltchenko et al. | 385/28 |

(Continued)

FOREIGN PATENT DOCUMENTS

WO 2005055412 6/2005

OTHER PUBLICATIONS

Logan, et al.; Stabilization of Oscillator Phase Using a Fiber-Optic Delay-Line; 1991; 45th Annual Symposium on Frequency Control; pp. 508-512, no month.

(Continued)

*Primary Examiner*—Kevin S. Wood
(74) *Attorney, Agent, or Firm*—Fish & Richardson P.C.

(57) ABSTRACT

Integrated opto-electronic oscillators that use micro resonators in the optical section of the opto-electronic feedback loop.

18 Claims, 19 Drawing Sheets

U.S. PATENT DOCUMENTS

| | | | |
|---|---|---|---|
| 6,417,957 B1 | 7/2002 | Yao | 359/334 |
| 6,473,218 B1 | 10/2002 | Maleki et al. | 359/245 |
| 6,476,959 B2 | 11/2002 | Yao | 359/334 |
| 6,487,233 B2 | 11/2002 | Maleki et al. | 372/108 |
| 6,488,861 B2 | 12/2002 | Iltchenko et al. | 216/24 |
| 6,490,039 B2 | 12/2002 | Maleki et al. | 356/436 |
| 6,535,328 B2 | 3/2003 | Yao | 359/334 |
| 6,567,436 B1 * | 5/2003 | Yao et al. | 372/32 |
| 6,580,532 B1 | 6/2003 | Yao et al. | 359/111 |
| 6,594,061 B2 | 7/2003 | Huang et al. | 359/239 |
| 6,762,869 B2 | 7/2004 | Maleki et al. | 359/239 |
| 6,795,481 B2 | 9/2004 | Maleki et al. | 372/108 |
| 6,798,947 B2 | 9/2004 | Iltchenko | |
| 6,853,479 B1 | 2/2005 | Ilchenko et al. | 359/337.5 |
| 6,871,025 B2 | 3/2005 | Maleki et al. | 398/183 |
| 6,873,631 B2 * | 3/2005 | Yao et al. | 372/32 |
| 6,879,752 B1 | 4/2005 | Ilchenko et al. | 385/30 |
| 6,901,189 B1 | 5/2005 | Savchenkov et al. | 385/39 |
| 2004/0100675 A1 | 5/2004 | Matsko et al. | 359/245 |
| 2004/0218880 A1 | 11/2004 | Matsko et al. | 385/122 |
| 2004/0240781 A1 | 12/2004 | Savchenckov et al. | 359/321 |
| 2005/0017816 A1 | 1/2005 | Ilchenko et al. | 398/161 |
| 2005/0074200 A1 | 4/2005 | Savchenkov et al. | 385/15 |
| 2005/0123306 A1 | 6/2005 | Ilchenko et al. | 398/161 |
| 2005/0128566 A1 | 6/2005 | Savchenkov et al. | 359/321 |

OTHER PUBLICATIONS

L.E. Myers, et al.; Quasi-phase-matched optical parametric oscillators in bulk periodically poled LiNbO$_3$; Nov. 1995; J.Opt. Soc. Am. B/vol. 12, No. 11; pp. 2102-2116.

X. Steve Yao, et al.; Converting Light into Spectrally Pure Microwave Oscillation; Apr. 1996; Optics Letters, vol. 21, No. 7; pp. 483-485.

H. Ito, et al.; InP/InGaAs uni-travelling-carrier photodiode with 310 GHz receiver; Oct. 12, 2000; Electronics Letters, vol. 36, No. 21; pp. 1809-1810.

Little et al., "Pedestal ARROWs for Robust Coupling to Microsphere Resonators and for Microphotonic Circuits", *Optical Letters*, vol. 25, pp. 73-75, 2000, no month.

Laine et al., "Acceleration Sensor Based on High-Q Optical Microsphere Resonator and Pedestal Antiresonant Reflecting Waveguide Coupler", *Elsevier Science B.V.*, 2001, reprinted from *Sensors and Actuators* vol. A 93, pp. 1-7, 2001, no month.

V. Ilchenko, et al.; Sub-Micro Watt Photonic Microwave Receiver; Nov. 2002; IEEE Photonics Technology Letters, vol. 14, No. 11; pp. 1602-1604.

* cited by examiner

INTEGRATED OPTO-ELECTRONIC OSCILLATORS

This application claims the benefit of U.S. Provisional Patent Application No. 60/578,565 entitled "INTEGRATED OPTO-ELECTRONIC OSCILLATORS" and filed on Jun. 9, 2004, the disclosure of which is incorporated herein by reference as part of the specification of this application.

BACKGROUND

This application relates to oscillators including opto-electronic oscillators.

An opto-electronic oscillator (OEO) may be designed to include at least one closed loop to generate a desired oscillation signal. Some examples of such an OEO are described in, e.g., U.S. Pat. No. 5,723,856 to Yao and Maleki, U.S. Pat. No. 5,777,778 to Yao, U.S. Pat. No. 5,929,430 to Yao and Maleki, and U.S. Pat. No. 6,567,436 to Yao, Maleki, and Ilchenko. In these examples, an OEO includes an electrically controllable optical modulator and at least one active opto-electronic feedback loop that comprises an optical part and an electrical part interconnected by a photodetector. The opto-electronic feedback loop receives the modulated optical output from the modulator and converted it into an electrical signal to control the modulator. The loop produces a desired delay and feeds the electrical signal in phase to the modulator to generate and sustain both optical modulation and electrical oscillation in radio frequency spectrum when the total loop gain of the active opto-electronic loop and any other additional feedback loops exceeds the total loss.

OEOs use optical modulation to produce oscillations in frequency spectral ranges that are outside the optical spectrum, such as in the RF and microwave frequencies. The generated oscillating signals are tunable in frequencies and can have narrow spectral linewidths and low phase noise in comparison with the signals produced by other RF and microwaves oscillators. Notably, the OEOs are optical and electronic hybrid devices and allow for versatile applications.

Notably, a high-Q optical resonator may be disposed in the optical part of the opto-electronic feedback loop or in another optical feedback loop coupled to the opto-electronic feedback loop, to provide a sufficiently long energy storage time and an optical filtering mechanism to produce an oscillation of a narrow linewidth and low phase noise. The mode spacing of the optical resonator is equal to one mode spacing, or a multiplicity of the mode spacing, of the opto-electronic feedback loop. In addition, the oscillating frequency of the OEO is equal to one mode spacing or a multiple of the mode spacing of the optical resonator. The above cited U.S. Pat. No. 6,567,436 describes examples of OEOs with at least one optical resonator in the optical part of the opto-electronic feedback loop.

The optical resonator may be implemented in a number of configurations, including, e.g., a Fabry-Perot resonator, a fiber ring resonator, and an optical resonator operating in one or more whispering-gallery modes (WGMs) such as microsphere, microdisk, and microring WGM resonators. In particular, non-spherical WGM resonators may be used. These and other optical resonator configurations can reduce the physical size of the OEOs and allow integration of an OEO with other photonic devices and components in a compact package such as a single semiconductor chip.

SUMMARY

This application describes implementations of integrated OEOs having WGM resonators in the optical loop of the OEOs. In one implementation, an opto-electronic device is described to include a substrate; first and second waveguides formed on the substrate; a first grating coupler formed in the first waveguide to couple input light incident to the substrate into the first waveguide; an optical resonator in optical communication with the first and second waveguides to exchange light; an optical modulator coupled to the first waveguide and operable to modulate light in the first waveguide in response to an electrical modulation signal; a photodetector positioned on the substrate to receive and convert an optical output from the second waveguide into an electrical signal; and an electrical link coupled between the photodetector and the optical modulator to produce the electrical modulation signal from said electrical signal.

In another implementation, an opto-electronic device includes a substrate; an optical ring cavity formed on the substrate to circulate light; an optical resonator on the substrate and optically coupled to the optical ring cavity via evanescent coupling; an optical modulation mechanism in the optical ring cavity to modulate light in the optical ring cavity in response to a modulation control signal; a photodetector on the substrate to receive a portion of the light in the optical ring cavity; and a feedback circuit to receive a detector output from the photodetector and to produce the modulation control signal from the detector output.

These and other implementations and designs for integrated OEOs are described in greater details in the attached drawings, the detailed description, and the claims.

DETAILED DESCRIPTION

This application describes various implementations of integrated opto-electronic oscillators having optical micro resonators. An example of an OEO may include an optical modulator, an opto-electronic loop, and an optical resonator coupled in the optical section of the opto-electronic loop. The optical modulator has an electrical input port to accept an electrical modulation signal and an optical input port to receive an input optical carrier signal at an optical carrier frequency, and is operable to generate an output optical carrier signal which is modulated at an oscillation frequency related to the electrical modulation signal. The opto-electronic loop includes an optical section coupled to receive at least a portion of the output optical carrier signal and an electrical section coupled to the electrical input port to produce the electrical modulation signal. This opto-electronic loop produces a delay in the electrical modulation signal to provide a positive feedback to the optical modulator. The optical resonator may be designed to have a free spectral range that is greater than a mode spacing of the opto-electronic loop but less than the optical carrier frequency and the oscillation frequency.

Figure 1:
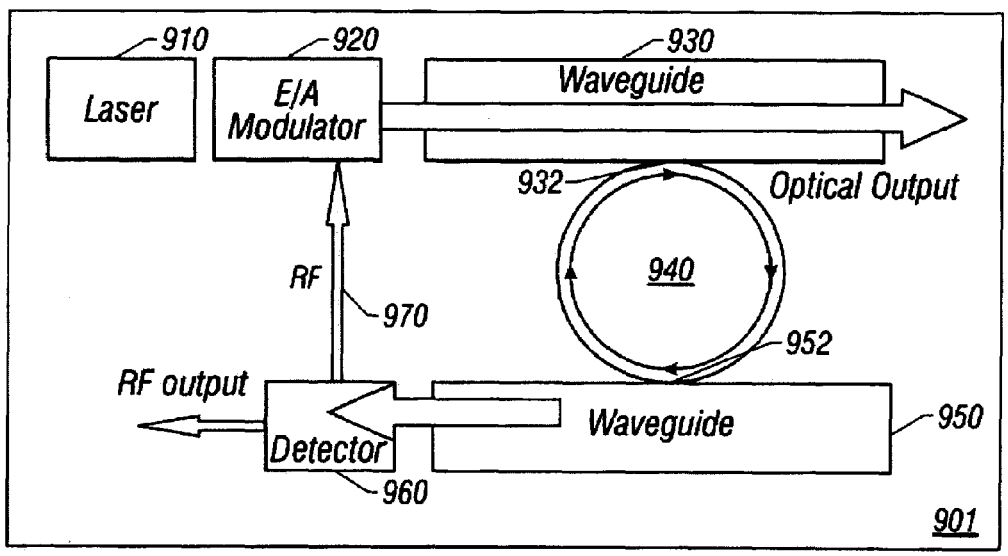
FIGS. 1, 2 and 3 show examples of integrated coupled OEO designs.

FIG. 1 shows an example of an integrated OEO on a single chip. This OEO includes a substrate formed of a semiconductor, a glass, or other material suitable for micro fabrication. A semiconductor laser is formed on the substrate to produce a laser beam. An optical modulator such as a semiconductor modulator is formed on the substrate to receive and modulate the laser beam from the laser in response to an electrical modulation signal. The OEO also includes a first waveguide formed on the substrate and coupled to receive a modulated optical signal from the optical modulator, an optical resonator formed on the substrate and coupled to the first waveguide to receive a portion of the modulated optical signal, and a second waveguide formed on the substrate and coupled to receive a portion of the modulated optical signal in the optical resonator. In addition, a semiconductor photodetector is formed on the substrate to receive and convert an optical output from the second waveguide into an electrical signal. An electrical link is further formed on the substrate and coupled between the photodetector and the optical modulator to produce the electrical modulation signal from the electrical signal.

In FIG. 1, all components of the OEO are fabricated on the semiconductor substrate 901. The integrated OEO 900 includes a semiconductor laser 910, a semiconductor electro-absorption modulator 920, a first waveguide 930, a micro resonator 940 in whispering gallery modes, a second waveguide 950, and a photodetector 960. An electrical link 970, e.g., a conductive path, is also formed on the substrate 901 to electrically couple the detector 960 to the modulator 920. The micro resonator 940 may be implemented in various configurations, such as a microsphere, a micro disk, or a ring and operates in the whispering-gallery modes. The micro resonator 940 is used as a high-Q energy storage element to achieve low phase noise and micro size. A RF filter may be disposed in the link 970 to ensure a single-mode oscillation. In absence of such a filter, a frequency filtering effect may also be achieved by a narrow band impedance matching between the modulator 920 and the detector 960.

Both waveguides 930 and 950 have coupling regions 932 and 952, respectively, to provide proper optical coupling at two different locations in the micro resonator 940. The first waveguide 930 has one end coupled to the modulator 920 to receive the modulated optical output and another end to provide an optical output of the OEO 900. The second waveguide 950 couples the optical energy from the micro resonator 940 and delivers the energy to the detector 960.

The complete closed opto-electronic loop is formed by the modulator 920, the first waveguide 930, the micro resonator 940, the second waveguide 950, the detector 960, and the electrical link 970. The phase delay in the closed loop is set so that the feedback signal from the detector 960 to the modulator 920 is positive. In addition, the total open loop gain exceeds the total losses to sustain an opto-electronic oscillation. The previously described mode matching conditions are also required.

In some implementations of the OEO 900, an electrical signal amplifier can be connected between the detector 960 and the modulator 920. Photodetectors and modulators are usually terminated with a 50-ohm impedance to match that of the transmission line or other microwave components, although the intrinsic impedance of the detector 960 and modulator 920 are high, e.g., around a few kilo-ohms. Consequently, the generated photovoltage by the photodetector 960, which equals to its photocurrent multiplied by 50 ohm, can be too low to efficiently drive the modulator 920. In these cases, a signal amplifier can be used in the link 970 to drive the modulator 920.

However, the signal amplifier is a high-power element and thus can be undesirable in a highly integrated on-chip design such as the OEO 900. For example, the high power of the amplifier may cause certain problems due to its high thermal dissipation. Also, the amplifier can introduce noise or distortion, and may even interfere operations of other electronic components on the chip.

One distinctive feature of the OEO 900 is to eliminate such a signal amplifier in the link 970 by matching the impedance between the electro-absorption modulator 920 and the photodetector 960 at a high impedance value. The desired matched impedance is a value so that the photovoltage transmitted to the modulator 920, without amplification, is sufficiently high to properly drive the modulator 920. In certain systems, for example, this matched impedance is at about 1 kilo ohm or several kilo ohms. The electrical link 970 is used, without a signal amplifier, to directly connect the photodetector 960 and the modulator 920 to preserve their high impedance. Such a direct electrical link 970 also ensures the maximum energy transfer between the two devices 920 and 960. For example, a pair of a detector and a modulator that are matched at 1000 ohm has a voltage gain of 20 times that of the same pair that are matched at 50 ohm.

The OEO 900 in FIG. 1 essentially includes two resonant devices: the OEO closed loop and the optical resonator 940 within the OEO closed loop. These two resonant devices have different modes and certain mode matching conditions are to be met in order for the OEO 900 to operate properly. These conditions include: (1) the laser center frequency $v_{laser}$ of the input beam from the laser 910 is within one of the transmission peaks of the optical resonator 940 so that enough light can reach the photodetector to assure the open loop gain of the opto-electronic loop greater than unity, i.e., $$v_{laser} = M \cdot FSR_r,$$

where M is a positive integer and $FSR_r$ is the free spectral range of the optical resonator 940; (2) the free spectral range, $FSR_r$, of the optical resonator 940 is equal to one or a multiplicity of the mode spacing, $\Delta v_{OE\ Loop}$, of the natural modes in the opto-electronic loop, i.e., $$FSR_r = N \cdot \Delta v_{OE\ Loop},$$

where N is a positive integer (1, 2, 3, . . . ); and (3) the frequency·$\Delta v_{OEO}$ of the opto-electronic oscillation of the OEO equals to the multiples of the free spectral range $FSR_r$ of the resonator 940:

$$v_{OEO} = K \cdot FSR_r,$$

where K is also a positive integer (1, 2, 3, . . . ).

The condition (1) may be met by adjusting either of the laser frequency and the resonator 940. To adjust the cavity length of the micro resonator 940, a control signal may be used to cause a mechanical squeeze on the resonator 940, e.g., through a piezo-electric transducer. The refractive index of the resonator 940 may also be controlled by, e.g., a thermal control to change the temperature of the resonator 940 or an electrical control via an electro-optic effect of the material for the resonator 940.

Figure 2:
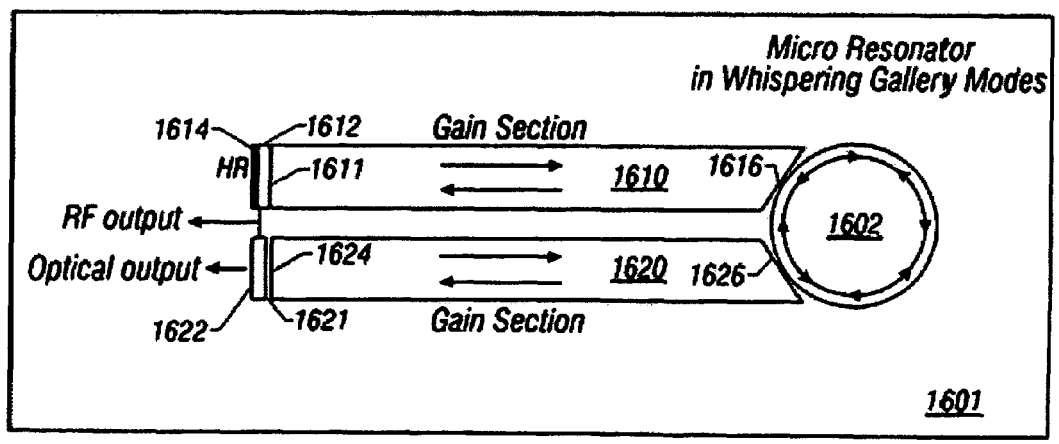

FIG. 2 shows another example of an integrated OEO based on a coupled OEO design. In coupled OEOs, a laser oscillation in an optical feedback loop is directly coupled to an electrical oscillation in an opto-electronic feedback loop. The laser oscillation and the electrical oscillation are correlated with each other so that both the modes and stability of one oscillation are coupled with those of the other oscillation. The optical feedback loop includes a gain medium to produce a loop gain greater than unity to effectuate the laser oscillation. This optical loop may be a Fabry-Perot resonator, a ring resonator, a whispering gallery mode resonator or other resonator configurations. The open loop gain in the opto-electronic loop is set to exceed the loss to sustain the electrical oscillation. The coupling between two feedback loops is achieved by controlling the loop gain of the optical loop by an electrical signal generated by the opto-electronic feedback loop. COEOs can achieve a single-mode RF oscillation without a RF bandpass filter or any additional opto-electronic feedback loops. A multi-mode laser may be used.

In the specific coupled OEO shown in FIG. 2, the OEO includes a substrate, a semiconductor optical modulator formed on the substrate to modulate an optical beam in response to an electrical modulation signal and having a first side and an opposing second side that define an optical path, and an optical reflector formed on the first side of the optical modulator. The OEO also includes a first waveguide, an optical resonator, and a second waveguide. The first waveguide is formed on the substrate, has a first end that is to receive a modulated optical signal from the optical modulator and is insulated from the optical modulator, and has a second end that has an angled facet. The optical resonator supports whispering gallery modes and is formed on the substrate and coupled to the angled facet of the first waveguide via evanescent coupling. The second waveguide is formed on the substrate and has a first end with an angled facet which is coupled to the optical resonator via evanescent coupling, and a second end. In addition, a semiconductor photodetector is formed on the substrate and spaced from the second end of the second waveguide to receive and convert an optical output from the second waveguide into an electrical signal. Between the photodetector and the optical modulator is an electrical link which is used to produce the electrical modulation signal from the electrical signal. The first and second waveguides are doped to produce an optical gain to produce a laser oscillation in a laser cavity formed between the optical reflector and the second end of the second waveguide.

More specifically, the OEO in FIG. 2 uses a micro cavity 1602 in whispering gallery modes in the OEO loop. The entire device is formed on the semiconductor substrate 1601 and includes two waveguides 1610 and 1620 that are coupled to a high Q micro cavity 1602 such as a microsphere or other resonator configurations. The waveguides 1610 and 1620 have angled ends 1616 and 1626, respectively, to couple to the micro cavity 1602 by evanescent coupling. The other end of the waveguide 1610 includes an electrical insulator layer 1611, an electro-absorption modulator section 1612, and a high reflector 1614. This high reflector 1614 operates to induce pulse colliding in the modulator 1612 and thus enhance the mode-locking capability. The other end of the waveguide 1620 is a polished surface 1624 and is spaced from a photodetector 1622 by a gap 1621. The surface 1624 acts as a partial mirror to reflect a portion of light back into the waveguide 1620 and to transmit the remaining portion to the photodetector 1622 to produce an optical output and an electrical signal. An electrical link 1630 is coupled between the modulator 1612 and photodetector 1622 to produce an electrical output and to feed the signal and to feed the electrical signal to control the modulator 1612.

Hence, two coupled feedback loops are formed in the device 1600. An optical loop is in the form of a Fabry-Perot resonator configuration, which is formed between the high reflector 1614 and the surface 1624 of the waveguide 1620 through the modulator 1612, the waveguide 1610, the micro cavity 1602, and the waveguide 1620. The gap 1621, the detector 1622, and the electrical link 1630 forms another opto-electronic loop that is coupled to the optical loop.

The waveguides 1610 and 1620 are optically active and are doped to also function as the gain medium so that the optical loop operates as a laser when activated by a driving current. This current can be injected from proper electrical contacts coupled to an electrical source. The gain of the laser is modulated electrically by the modulator 1612 in response to the electrical signal from the photodetector 1622.

The photodetector 1622 can be structurally identical to the electro-absorption modulator 1612 but is specially biased to operate as a photodetector. Hence, the photodetector 1622 and the modulator 1612 have a similar impedance, e.g., on the order of a few kilo ohms, and thus are essentially impedance matched. Taking typical values of 2 volts modulator switching voltage, 1 kilo ohm for the impedance of the modulator 1612 and photodetector 1622, the optical power required for the sustained RF oscillation is estimated at about 1.28 mW when the detector responsivity is 0.5 A/W. Such an optical power is easily attainable in semiconductor lasers. Therefore, under the impedance matching condition, a RF amplifier can be eliminated in the electrical link 1630.

The two waveguides 1610 and 1620 may be positioned adjacent and parallel to each other on the substrate 1601 so that the photodetector 1622 and the modulator 1612 are close to each other. This arrangement facilitates wire bonding or other connection means between the photodetector 1622 and the modulator 1612.

Figure 3:
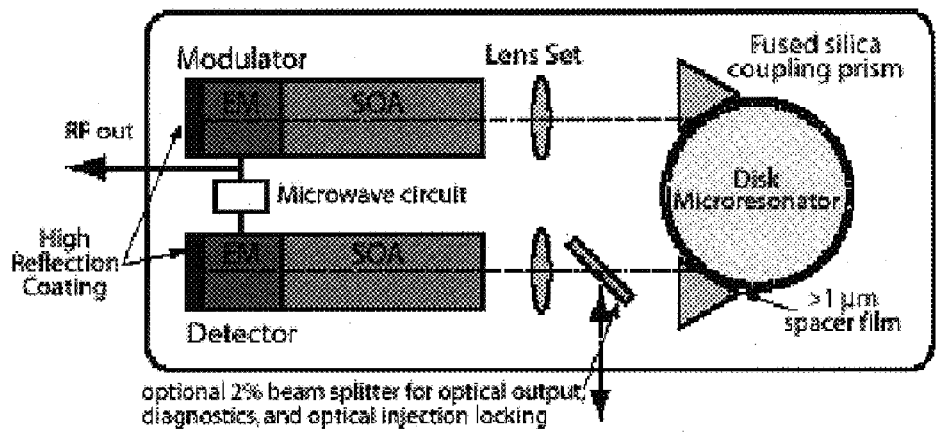

FIG. 3 shows anther example of a coupled OEO in an integrated package where the optical and RF circuits of the OEO are shown. A disk microresonator and the gain elements, semiconductor optical amplifier (SOA) chips and electro-absorption modulator (EM) chips, are optically coupled together to form the OEO. The entire structure essentially forms a folded laser cavity bounded on both ends by the high reflection coatings on the two EM segments. The SOA segments comprise the lasing medium which provides the optical gain to generate and sustain the signal oscillation. Light propagates from the high reflectivity coating that caps the EM at the upper left through the upper SOA/EM and out into free space. A set of lenses is used to focus the beam into a silica coupling prism, which presses against the disk microresonator. Light injected into the disk circulates around thousands of times on average before coupling out to the lower SOA/EM. The lower HR coating reflects light back in the other direction.

The lower EM may be reverse biased to function as a photodetector. The upper EM is forward biased, and serves as a modulator. The lower EM absorbs a small sample of the light that impinges thereon. A microwave circuit connects the two EMs and impresses the photodetector signal from the lower EM onto the upper EM to modulate the light intensity at the opposite end of the laser cavity. This final step closes the feedback loop that drives the device into a self-sustained oscillation with ultra-high spectral purity.

Two coupling prisms are shown in FIG. 3 as the evanescent couplers for coupling light into and out of the microresonator. The prisms may be made of fused silica and other suitable optical materials. A spacer film of a dielectric material may be used as an interface between each prism and the microresonator and are in direct contact with the prism and the microresonator to stabilize the relative position between the prism and the microresonator.

In operation, the microresonator permits only light that matches the frequency of a whispering gallery mode to pass through, forcing the oscillator circuit to match the frequencies set by the microresonator diameter. The microwave circuit is tuned to just one whispering gallery mode and acts as a signal filter that selects the correct mode. Since the free spectral range of the microresonator can be high (>10 GHz), there are no spurious modes close to the desired mode, and the filtering in the microwave circuit can be broad (Q~100).

The microresonator diameter may be changed to directly change the oscillation frequency (e.g., shrinking the microresonator increases the oscillation frequency). Unlike conventional oscillators, which exhibit increased noise when the frequency increases, the spectral purity of OEOs described here does not degrade as the operating frequency increases.

A number of integration configurations may be used to construct integrated OEOs. Several examples are described below.

Figure 4:
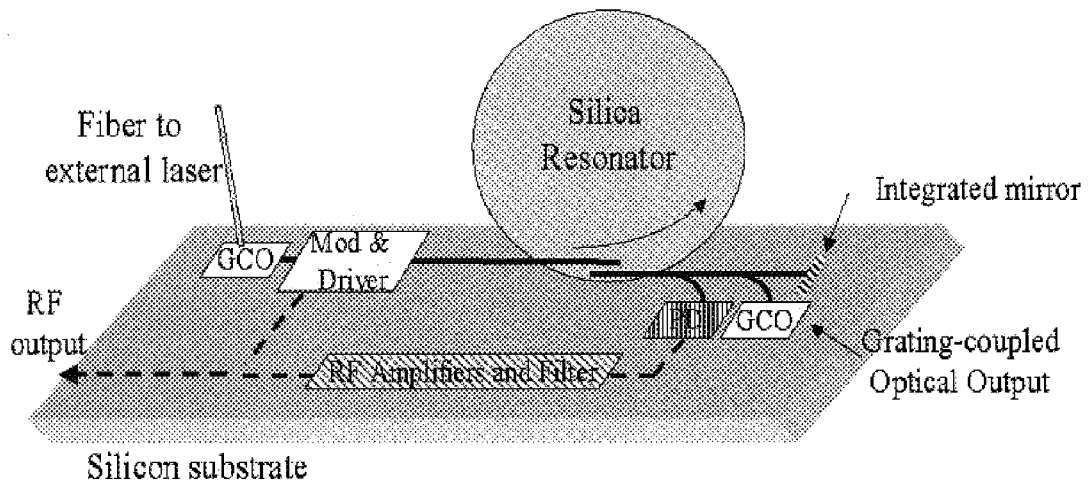
FIG. 4 shows an integrated OEO that use two grating couplers to receive an input pump beam and to output an optical output, respectively.

FIG. 4 illustrates an integrated OEO on a substrate (e.g., a silicon substrate) that uses two waveguide couplers to couple the microresonator. Optical waveguides are formed on the Si substrate to direct light. An optical grating coupler (GCO) is formed on the Si substrate as an input optical port to couple an input laser beam from a laser off the Si substrate to the integrated OEO. The input laser beam may be guided to the grating coupler via a fiber positioned above the Si substrate. The fiber has an end facet positioned above the Si substrate and directs the input laser beam to the grating coupler via air. Alternatively, the fiber may have its end facet engaged to the grating coupler so that the input laser beam is directly coupled from the fiber to a receiving waveguide or a device on the Si substrate. The input laser beam incident to the OEO chip may be at an incident angle with respect to the normal direction of the surface of the substrate of the OEO chip or at or close the normal direction. The grating coupler redirects the incident laser beam in a direction substantially parallel to the substrate surface. In FIG. 4, the grating coupler is connected to an optical waveguide on the Si substrate and the waveguide directs the input laser beam from the grating coupler in a direction parallel to the substrate surface to an optical modulator and its driver circuit labeled as "Mod&Driver" that are integrated on the Si substrate. Another optical waveguide on the Si substrate receives the modulated output light from the optical modulator and sends the light to a microresonator in the opto-electronic loop of the OEO.

The microresonator may be a silica resonator, e.g., a toroidal disk resonator or a spherical resonator, and is engaged to the Si substrate in a way to allow for proper optical coupling with the waveguide from the modulator and another waveguide that is connected to an integrated mirror, a photodiode as part of the opto-electronic loop, and a grating coupler as the optical output port for the OEO. The output grating coupler redirects an output beam of the OEO chip which is usually parallel to the substrate surface towards a location above the OEO chip along a predetermined direction that is either along or at an acute angle with the normal direction of the substrate surface. An RF filter and an RF amplifier may be integrated in the output path of the photodiode in the electrical section of the opto-electronic loop and is connected to an RF output port to produce the RF oscillation output and to generate the RF feedback signal to the driver of the optical modulator to complete the loop. The grating output coupler may be used to output the optical signal from the OEO off the OEO chip, e.g., a fiber receiver positioned above the Si substrate to receive the output light or a fiber directly engaged to the grating output coupler to guide the output light off the OEO chip. This design for optical coupling above the chip provides a unique way for optically accessing and addressing the integrated OEO and, in some applications, for accessing the OEO and other devices on the chip in parallel.

The photodetector may be fabricated on a separate chip, e.g., a detector made of a III-V semiconductor such as an InP detector and the photodetector chip is then integrated to the Si substrate by using, e.g., the flipchip approach to electrically and optically connect the photodetector to the OEO chip. Alternatively, the photodetector may be monolithically integrated on the OEO chip. Similarly, a laser may be integrated onto the OEO chip by the flipchip approach or by monolithically fabricated on the OEO chip.

The optical mode mismatch between the two dissimilar materials (Si semiconductor waveguides and silica resonator) can lead to significant optical loss in certain implementations. The whispering gallery modes (WGM) of the microresonator reside near the surface of the resonator and derive their high Q from containing the field within the resonator. A WG mode only extends to a small region approximately the size of the wavelength of light (~1 micron) outside the resonator. Any coupling to the mode should be made by matching the energy and momentum of light being coupled, to that of the WGM, within this small (evanescent) region. This "phase matching" condition is inherently difficult to meet when materials of vastly different indices of refraction (and therefore different propagation constants), such as III-V semiconductors (e.g., InP) and glass or Silicon and glass, are involved. Even when the indices are compatible, matching the mode of an optical waveguide, such as a fiber, to the WGM mode may require the waveguide to be modified.

Figure 5:
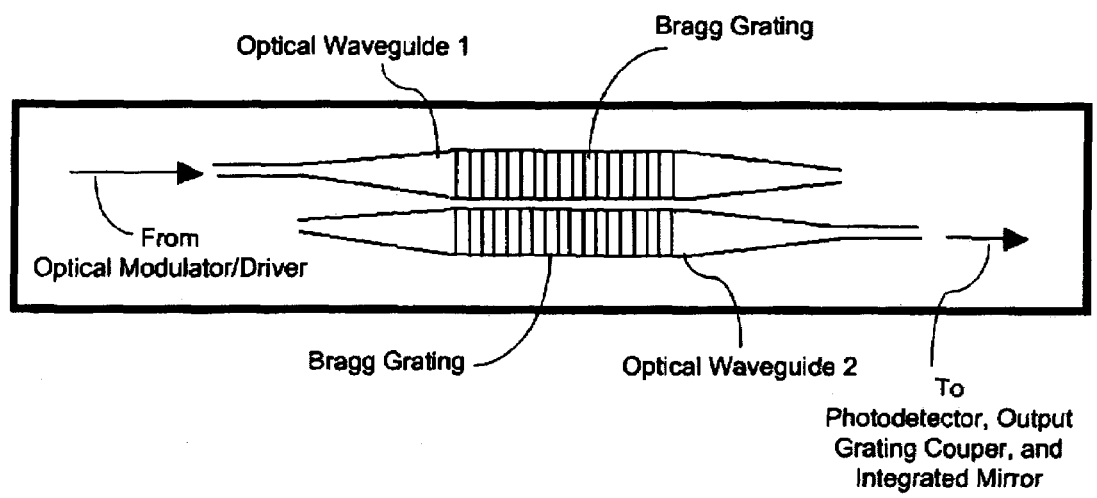
FIG. 5 shows an exemplary optical coupling design for the microresonator in an integrated OEO where two Bragg gratings in two waveguides are used to assist the evanescent coupling.

FIG. 5 illustrates one example of a suitable coupling mechanism for achieving the phase matched coupling between the two Si waveguides 1 and 2 the microresonator in FIG. 4. In this example, each waveguide may be designed to include an embedded Bragg grating. The Bragg grating is positioned near the microresonator to couple light into and out of the microresonator. As illustrated, the two Bragg gratings are respectively positioned so that microresonator is engaged at a location to allow for evanescent coupling with the Bragg gratings of the two waveguides 1 and 2 in a phase-matched configuration to reduce coupling loss for coupling between the silicon waveguide and the silica microresonator.

The fiber gratings may be configured in various configurations. A fiber grating may be in a forward coupling mode or in a backward coupling mode. The grating may be chirped to have a spatial variation along the fiber. The width of the grating across the fiber may also be varied along the length of the fiber to provide a better match with the field profile of the evanescent field for efficient coupling.

In the integrated OEO in FIG. 4 using the grating coupling in FIG. 5, all components may be made by using the silicon CMOS technology and the RF circuits and the optics are integrated on the same chip. The photodetector may be a monolithically integrated detector. Alternatively, the photodetector may be an InP component and incorporated onto the platform using hybrid integration techniques such as flip-chip bonding. Alignment and coupling to the InP chips can be facilitated by using waveguide grating couplers on the Si platform which are matched to complementary waveguide grating couplers on the photodetector chip. The use of the grating coupler technology to couple the InP components can reduce insertion loss, e.g., less than 4 dB per device.

Figure 6:
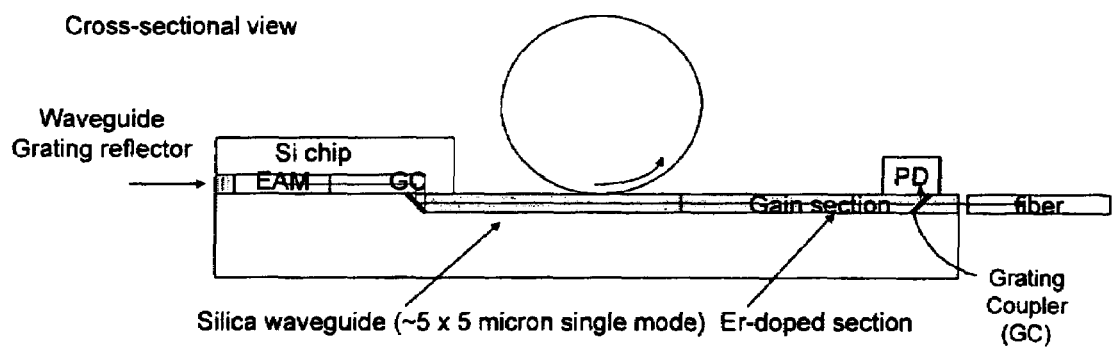
FIG. 6 shows an example of an integrated OEO that uses hybrid integration of a Si chip in the flip chip configuration and hybrid integration of a photodetector made of a III-V semiconductors as such as InP.
Figure 6:

FIG. 6 shows another example of an integrated coupled OEO on a silicon substrate. To avoid the material mismatch, the waveguides are silica waveguides formed on a silica-on-silicon substrate so that the waveguides and the silica microresonator are made of the same silica material. In addition, the silica waveguide may be doped with rare earth ions (e.g., Er ions) to produce optical gain within the OEO loop. A grating coupler (GC) can be used to couple light between the silica waveguides and the Si electro-absorption modulator (EAM). The EAM may be fabricated on a separate Si chip and is integrated to the OEO in a flip chip configuration where a Si chip is bond to electrical conductor bumps on top of the substrate in a face-down configuration (e.g., near the EAM to supply power and control the EAM). The silica waveguide may be optically coupled to an external fiber to output the light to the fiber. Another grating coupler may be formed in the silica waveguide to direct a fraction of light in the OEO loop to a photodetector (PD) which produces the RF output of the OEO. The insert in FIG. 6 shows the bird's eye view of the surface of the device from the top of the substrate.

Figures 7, 8:
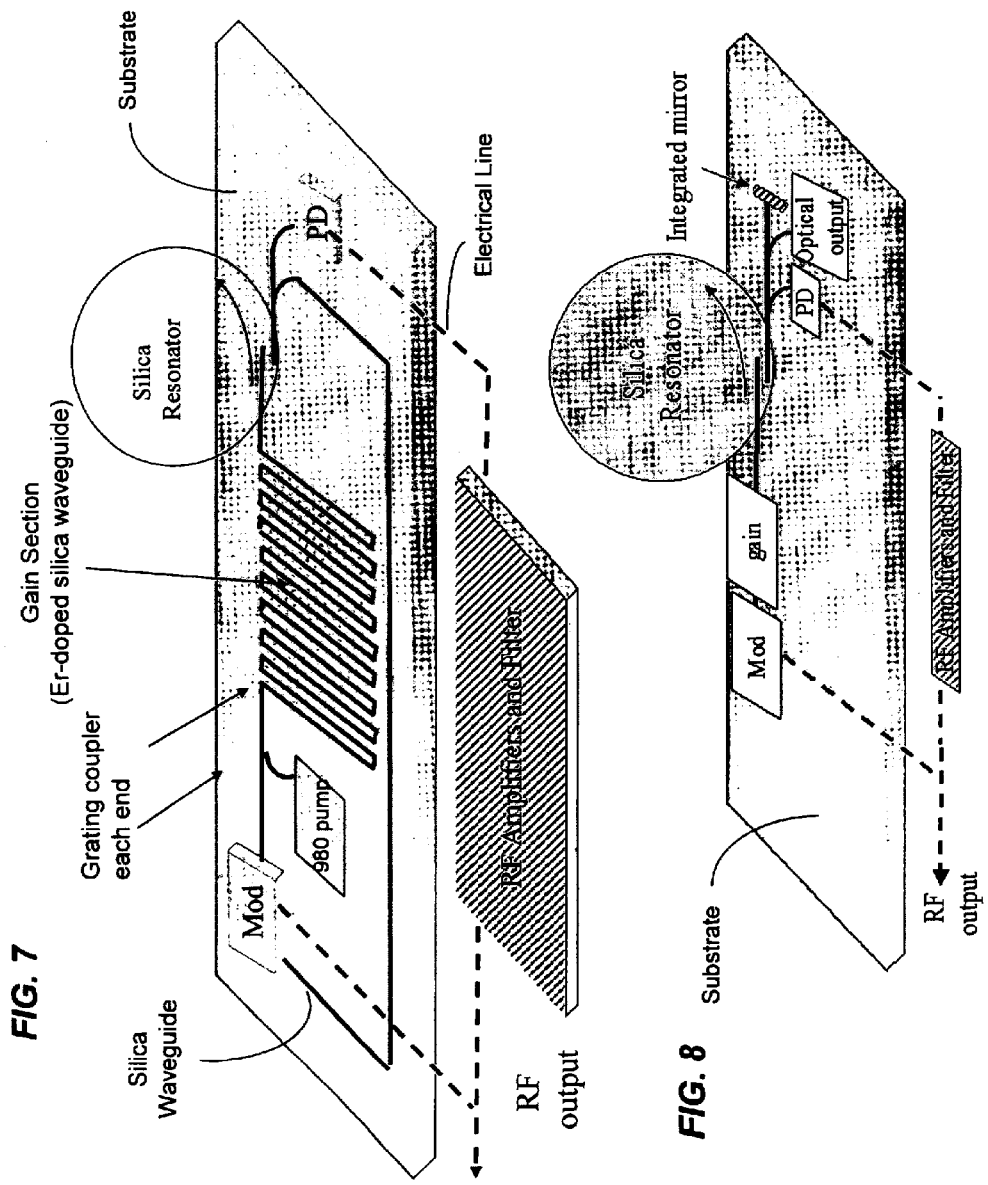
FIGS. 7, 8 and 9 show additional examples of integrated OEOs.

FIG. 7 shows another implementation of an integrated coupled OEO using silica waveguides on a silica-on-silicon substrate. In this example, the optical pump light source (e.g., at 980 nm) is integrated to the substrate and is coupled to an optical ring which includes the optical modulator and the microresonator. A doped waveguide arranged in a zigzag winding pattern on the substrate is used as the optical amplifier of the optical ring on the chip. Alternatively, an external pump source may be used and the pump light may be coupled to the substrate by using a grating coupler that couples light incident from above the substrate. A portion of the light in the ring is split out to a photodetector (PD) which is connected to the electrical section (RF section) of the OEO loop to produce the modulation control signal applied at the optical modulator. The RF section may be CMOS circuitry formed on a separate Si substrate.

FIG. 8 further shows an example of an integrated coupled OEO where all photonics components are integrated on a single chip formed of a semiconductor material such as a III-V semiconductor. As illustrated, the optical modulator (Mod), the optical gain medium, the photodetector (PD), the optical output grating coupler, and the integrated mirror are formed on the same substrate. The light is generated in the gain medium. The RF section of the OEO loop may be located outside the substrate. The laser may also be integrated on this chip.

In the above integrated OEOs, the microresonator is not monolithically integrated to the base substrate and hence the coupling between the microresonator and the waveguides on the substrate is used to provide the phase matching coupling to reduce the optical loss. Several examples of such coupling are described in this application. FIG. 5, for example, shows one implementation of a grating-assisted phase matching technique. The grating in each of two waveguides shown in FIG. 5 may be replaced by corrugations and other spatial perturbation patterns in the waveguide to create a quasi-phase-matched condition between the silica resonator and silicon waveguides.

Figure 9:
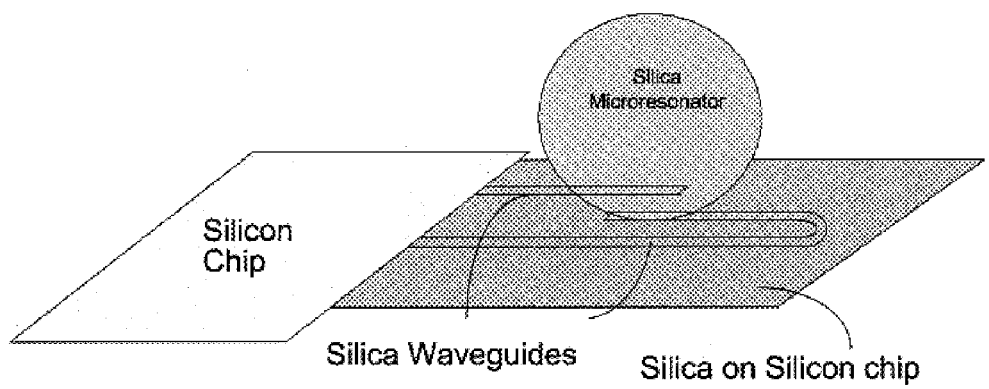

FIG. 9 shows another example of a resonator-waveguide coupling design for OEOs on a silica-on-silicon substrate where waveguides are silica waveguides. Each silica waveguide may be placed close to the silica resonator where the evanescent field exists without any grating or other spatial perturbation in the waveguide. The spacing between the waveguide and the resonator is selected to optimize the evanescent coupling. This coupling is a phase matched coupling and is relatively simple to implement without complex coupling structures. In addition, a separate silicon substrate can be integrated to the silica-on-silicon substrate to provide the CMOS-based RF components for the OEO. The Si substrate may be integrated in a flip chip configuration. Silica waveguides in this design may also be used to achieve low loss coupling to an external fiber because the fiber is made of silica. In addition, silica waveguides on the silica-on-silicon substrate may be optically coupled to the Si platform using grating couplers. Other components may also be incorporated onto the silica chip.

Alternatively, the silica waveguides in FIG. 9 may be replaced by stripline-pedestal anti-resonant reflecting optical waveguide (SPARROW) optical couplers. See, e.g., Little, B. E., et. al, in "Pedestal ARROWs for Robust Coupling to Microsphere Resonators and for Microphotonic Circuits," Optics Letters, Vol. 25, pp. 73–75 (2000). In this design, a multi-layer high-reflectivity stack may be formed from, e.g., alternate layers of Si and $SiO_2$, and may be used as the cladding for the waveguides to optically isolate the waveguide core. The stack may be designed as a quarter wave reflective stack for TE modes. In this design, the waveguides may be formed from a matching material such as silica for the resonator for efficient optical coupling. The use of the reflective stack as cladding can be used to minimize the optical leakage into cladding and substrate radiation modes.

Figure 10:
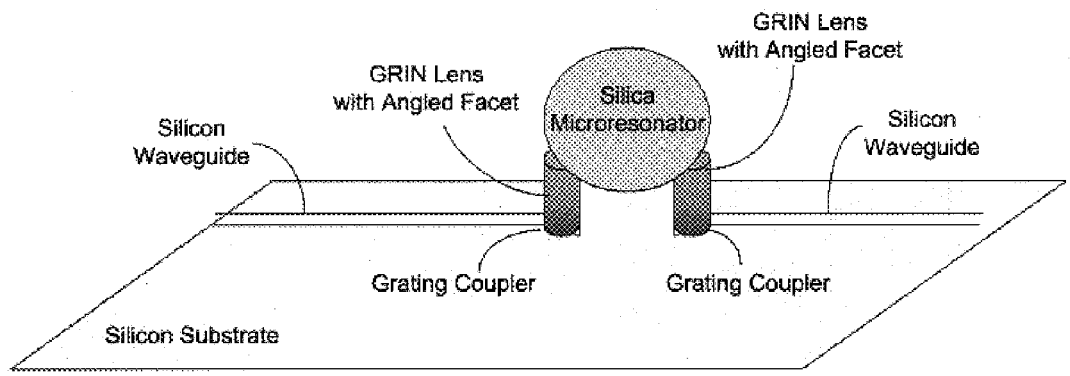
FIGS. 10, 11 and 12 show three exemplary coupling designs for engaging and coupling a micro resonator in an integrated OEO.

FIG. 10 shows another coupling scheme where the microresonator is positioned and held above the substrate on which the OEO is formed. Two GRIN (gradient index) lenses are used to (1) hold and support the silica microresonator at the designed position above the substrate (e.g., Si) and (2) provide the proper optical coupling with the microresonator. The end facet of each GRIN lens in contact with the microresonator is angled to provide a phase matched coupling condition. The opposite end facet is fixed to the substrate above the corresponding waveguide. A grating coupler is formed at the intersection of the waveguide and the GRIN lens to provide optical coupling between the GRIN lens and the waveguide by redirecting light between the vertical direction and the horizontal direction. Hence, one grating coupler is used as the input coupler to direct input light from one waveguide into the microresonator while the other grating coupler is used as the output coupler to direct light out of the microresonator into the other waveguide. The above design in FIG. 10 may provide good coupling efficiency. The material and the angular facet of each GRIN lens may be selected for optimal coupling to the resonator. As an example, Silica GRIN lenses with a diameter of about 1 mm and 1.8 mm may be used.

Figure 11:
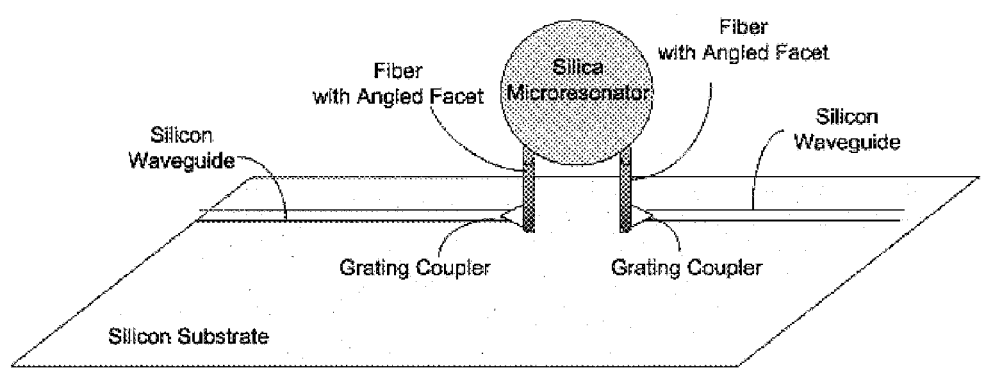

Alternatively, the GRIN lenses in FIG. 10 may be replaced two by fibers (e.g., single mode fibers) with angled facets as shown in FIG. 11. The coupling loss between the fiber end facet and the grating coupler may be about 2 dB or less in some implementations.

Figure 12:
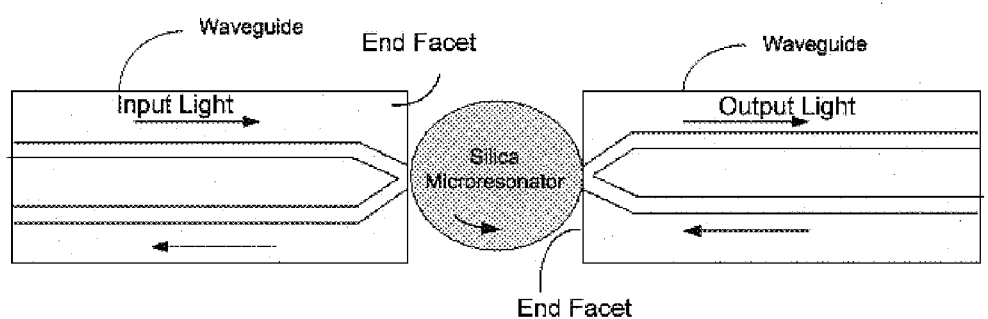

FIG. 12 shows another implementation of coupling between the waveguides and the microresonator where the microresonator is located between the two end facets of two waveguides at two opposite sides of the microresonator. The light is coupled via the evanescent field that "leaks" out of the end facet due to the total internal reflection within each waveguide at the end facet. The microresonator may be directly placed on the substrate. The end facet of each waveguide may be at a right angle as shown in FIG. 11 or at an acute angle.

In the above and other implementations of integrated OEOs, the microresonators may be WGM resonators formed of dielectric materials. The following sections describe exemplary resonator configurations suitable for the above implementations. Microsphere resonators with uniform refractive indices have been demonstrated to have a high Q factor greater than 1000 and up to $10^9$. Such high Q values are generally difficult and expensive to obtain in conventional Fabry-Perot optical resonators formed with mirrors.

Figure 13A:
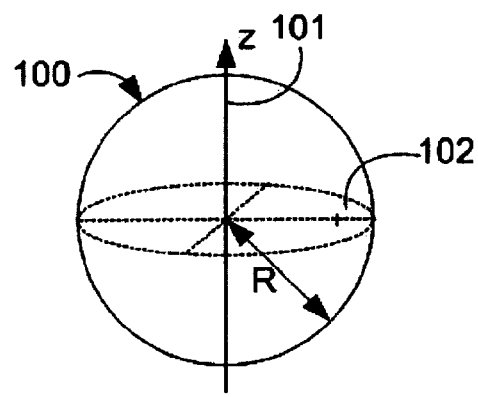
FIGS. 13A, 13B and 13C show three exemplary geometries of whispering gallery mode resonators.
Figure 13B:
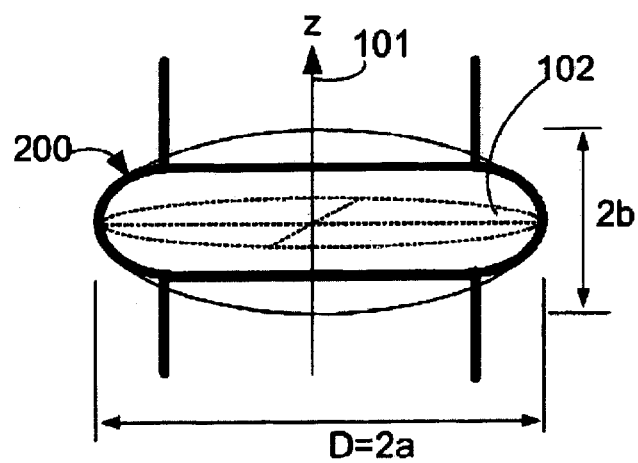
Figure 13C:
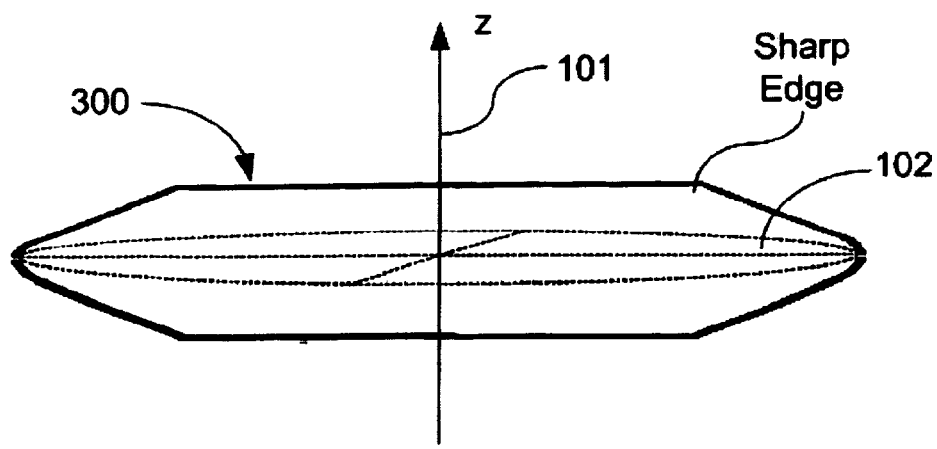

FIGS. 13A, 13B, and 13C illustrate three exemplary geometries for implementing the WGM resonators. FIG. 13A shows a spherical WGM resonator 100 which is a solid dielectric sphere. The sphere 100 has an equator in the plane 102 which is symmetric around the z axis 101. A WG mode exists around the equator within the spherical exterior surface and circulates within the resonator 100. The spherical curvature of the exterior surface around the equator plane 102 provides spatial confinement along both the z direction and its perpendicular direction to support the WG modes. The eccentricity of the sphere 100 generally is low.

FIG. 13B shows an exemplary spheriodal microresonator 200. This resonator 200 may be formed by revolving an ellipse (with axial lengths a and b) around the symmetric axis along the short elliptical axis 101(z). The eccentricity of resonator 100 is $(1-b^2/a^2)^{1/2}$ and is generally high, e.g., greater than $10^{-1}$. Hence, the exterior surface is the resonator 200 is not part of a sphere and provides more spatial confinement on the modes along the z direction than a spherical exterior. The equator plane 102 at the center of the resonator 200 is perpendicular to the axis 101(z) and the WG modes circulate near the circumference of the plane 102 within the resonator 200.

FIG. 13C shows another exemplary WGM resonator 300 which has a non-spherical exterior where the exterior profile is a general conic shape which can be mathematically represented by a quadratic equation of the Cartesian coordinates. Similar to the geometries in FIGS. 13A and 13B, the exterior surface provides curvatures in both the direction in the plane 102 and the direction of z perpendicular to the plane 102 to confine and support the WG modes. Such a non-spherical, non-elliptical surface may be, among others, a parabola or hyperbola.

The above three exemplary geometries in FIGS. 13A, 13B, and 13C share a common geometrical feature that they are all axially or cylindrically symmetric around the axis 101(z) around which the WG modes circulate in the plane 102. The curved exterior surface is smooth around the plane 102 and provides two-dimensional confinement around the plane 102 to support the WG modes.

Notably, the spatial extent of the WG modes in each resonator along the z direction 101 is limited both above and below the plane 102 and hence it may not be necessary to have the entirety of the sphere 100, the spheroid 200, or the conical shape 300. Instead, only a portion of the entire shape around the plane 102 that is sufficiently large to support the whispering gallery modes may be used to for the WGM resonator. For example, rings, disks and other geometries formed from a proper section of a sphere may be used as a spherical WGM resonator.

Figure 14A:
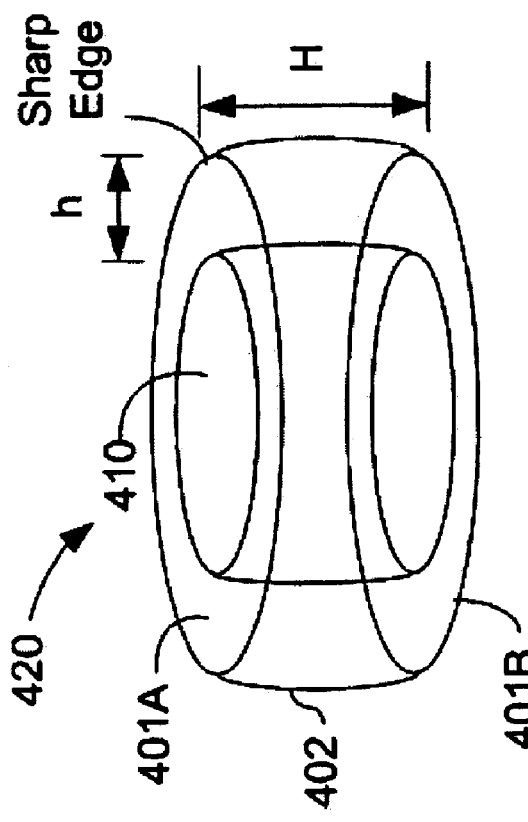
FIGS. 14A and 14B show a disk micro resonator and a ring micro resonator that support whispering gallery modes, respectively.
Figure 14B:
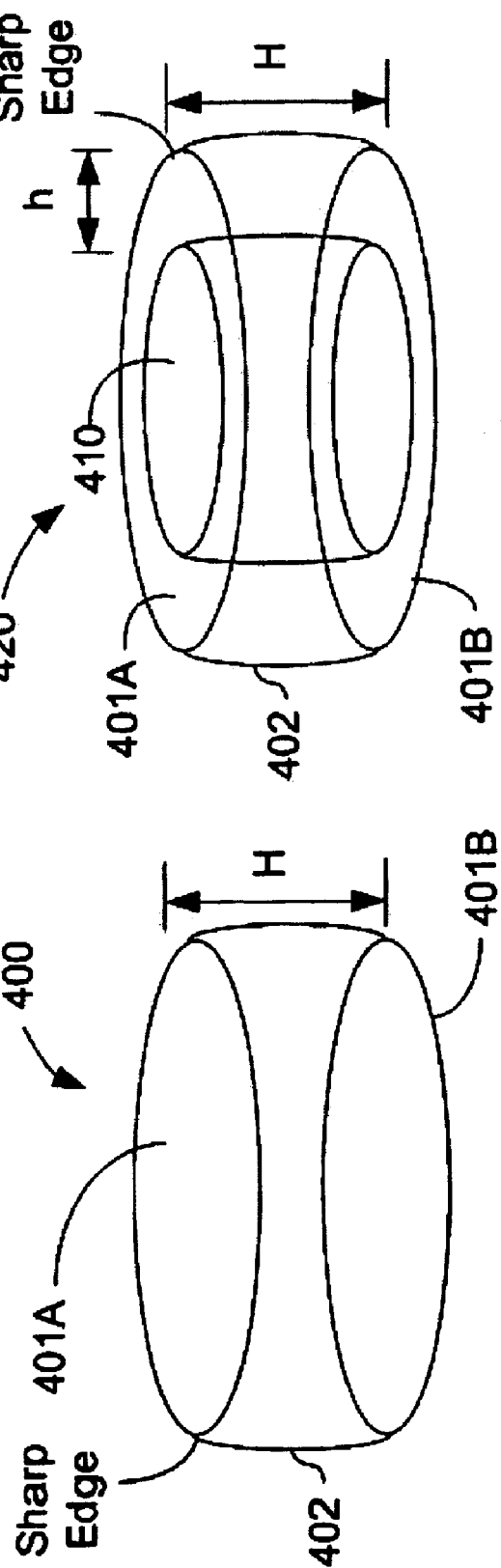

FIGS. 14A and 14B show a disk-shaped WGM resonator 400 and a ring-shaped WGM resonator 420, respectively. In FIG. 14A, the solid disk 400 has a top surface 401A above the center plane 102 and a bottom surface 401B below the plane 102 with a distance H. The value of the distance H is sufficiently large to support the WG modes. Beyond this sufficient distance above the center plane 102, the resonator may have sharp edges as illustrated in FIG. 13C, 14A, and 14B. The exterior curved surface 402 can be selected from any of the shapes shown in FIGS. 13A, 13B, and 13C to achieve desired WG modes and spectral properties. The ring resonator 420 in FIG. 14B may be formed by removing a center portion 410 from the solid disk 400 in FIG. 14A. Since the WG modes are present near the exterior part of the ring 420 near the exterior surface 402, the thickness h of the ring may be set to be sufficiently large to support the WG modes.

Optical coupling with a WGM resonator may be achieved via direct evanescent coupling or evanescent coupling via an optical coupler. Examples of optical coupling for evanescent coupling include angle-polished fiber tips, angled waveguides, and GRIN lenses, prisms, and gratings. In addition, evanescent couplers such as an coupler formed from photonic bandgap materials may be used for coupling with the resonators in the integrated OEOs.

As described below, the graded index may be selected to shift the WG modes away from the exterior surface of the WGM resonator. Hence, the optical coupler may be in direct contact with the exterior surface of the resonator to effectuate the desired critical coupling under the proper mode-matching condition. Notably, in WGM resonators with uniform indices, a part of the electromagnetic field of the WG modes is located at the exterior surface of the resonators A gap between the optical coupler and the WGM resonator with a uniform index is generally needed to achieve a proper optical coupling. This gap is used to properly "unload" the WG mode. The Q-factor of a WG mode is determined by properties of the dielectric material of the WGM resonator, the shape of the resonator, the external conditions, and strength of the coupling through the coupler (e.g. prism). The highest Q-factor may be achieved when all the parameters are properly balanced to achieve a critical coupling condition. In WGM resonators with uniform indices, if the coupler such as a prism touches the exterior surface of the resonator, the coupling is strong and this loading can render the Q factor to be small. Hence, the gap between the surface and the coupler is used to reduce the coupling and to increase the Q factor. In general, this gap is very small, e.g., less than one wavelength of the light to be coupled into a WG mode.

WGM resonators with spatially graded indices may be used to achiever other advantages as well. WGM resonators with uniform refractive indices have complex spectral pattern with unequal mode spacings and a high spectral density. Hence, in comparison with conventional Fabry-Perot resonators, these spectral characteristics of the WGM resonators with uniform refractive indices may potentially limit the performance or the range of applications using such WGM resonators.

Spherical WGM microcavities (microspheres) with uniform refractive indices, for example, are overmoded with complex quasi-periodic spectra and unequal mode spacings caused by, e.g., the material dispersion and the resonator dispersion. A highly oblate spheroidal microresonator (microtorus) may be used to significantly reduce the mode spectral density but it is technically difficult, if not impossible, to achieve equal mode spacings for different WG modes in spheroidal cavities with uniform refractive indices.

In WGM resonators with uniform resonator materials, the resonator dispersion increases as the resonator size decreases. This increased resonator dispersion in turn causes the unequal spectral separation between adjacent modes to increase. This undesired feature is rooted in the fact that the radial distribution of whispering-gallery resonant modes is dependent on the frequency of light in the WG modes. Higher frequency modes propagate on paths that are slightly closer to the surface than those of lower-frequency modes. Thus higher-frequency modes travel in trajectories of a slightly larger radius and slightly longer optical path lengths.

Optical path length of a mode by definition is a function of both the physical distance and the refractive index in the physical path of light. The WGM resonators may use a graded refractive index to modify both the refractive index and the physical location of a WG mode to produce optical spectra of WG modes that are different from the optical spectra produced by WGM resonators with uniform refractive indices. The graded refractive index is specially designed in order to produce mode spacings that are equal or substantially equal for different WG modes. In addition, the graded refractive index of such a WGM resonator may be designed to change the spatial confinement of the WG modes by shifting the spatial distribution of each WG mode away from the exterior surface of the resonator towards the interior of the resonator. Accordingly, the mode volumes of WG modes are increased and displaced away from the exterior surface of the resonator. This spatial shift in the mode location may be used to reduce the overall optical loss at the exterior surface caused by adverse effects of surface contamination and roughness and to achieve a high Q value closer to the high Q value of the resonator under ideal conditions. Furthermore, with the modal field being displaced deeper into the interior of the resonator, optimal coupling with an evanescent coupler, such as a prism or an angled-fiber tip, may be achieved by direct physical contact of the coupler with the resonator. This direct contact avoids the technical difficulties associated with maintaining the airgap between the coupler and a WGM resonator made of a dielectric material with a spatially uniform index profile.

The performance and range of applications based on WGM microcavities can be significantly expanded if a method is found to make microresonator modes equally spaced with precision corresponding to a fraction of the resonance bandwidth of a WGM resonator. Such a dielectric microresonator with an equidistant mode spectrum is similar to the spectrum of a typical Fabry-Perot resonator formed with two reflective mirrors. Such dielectric resonators with an equidistant spectrum may be used, for example, in frequency comb generators, optical pulse generators, broadband energy-storage circuits of electro-optical devices, and in other applications where conventional optical Fabry-Perot cavities are utilized.

This requirement of a gap can be problematic in device design and manufacture because the gap must be maintained at a critical angle and with a critical distance.

The WGM resonators with graded indices may be designed with a spatial gradient profile for the refractive index to shift the WG modes away from the exterior surface towards the interior of the resonator so that the optical coupler in direct contact with the exterior surface can be used to achieve the critical coupling condition without the air gap. In addition, this shift of the WG modes can also reduce optical loss caused by the scattering and absorption by the imperfections and contaminants on the exterior surface of the resonator. This reduced loss leads to high values in the Q factor.

Referring back to FIGS. 13A through 14B, the graded index profile for the WGM resonators, like the geometrical shapes of the resonators, may also have axially or cylindrically symmetric spatial profiles with respect to the same axis 101(z). According to one implementation, the graded index profile of such a WGM resonator should at least vary along the radial direction, i.e., $n=n(r)$ where $r=(x^2+y^2)^{1/2}$. This radial profile $n(r)$ may have different configurations. In one configuration, for example, the index changes with r throughout the entire resonator from the most inner part where r is at its minimum to the exterior surface where r is at its maximum at each given z within the resonator. The graded index is used here to modify the WG modes and thus it may suffice to have the graded profile only at the outer portion of the resonator because the WG modes are centered near the exterior surface of the resonator. Therefore, in another exemplary configuration, the index may be set at a predetermined constant $n_o$ along the radial direction at the inner part of the resonator but have a radial variation at the outer part of the resonator: $n=n_o+n_r(r)$, where $n_r(r)=0$ when $r<r_o$ and varies with r when $r \geq r_o$. The $r_o$ and the gradient function $n_r(r)$ are selected to place the center of each WG mode where the mode strength is maximum at a desired location away from the exterior surface.

In general, the graded index $n(r)$ or the gradient portion $n_r(r)$ decreases as r increases in order to place the center of each WG mode away from the exterior surface of the resonator. In other applications such as sensing based on WGM resonators, the graded index $n(r)$ or the gradient portion $n_r(r)$ increases as r increases.

The above integrated OEO designs and various optical coupling mechanisms may be used to construct OEOs in different configurations. FIGS. 15A through 15D show some examples.

Figure 15A:
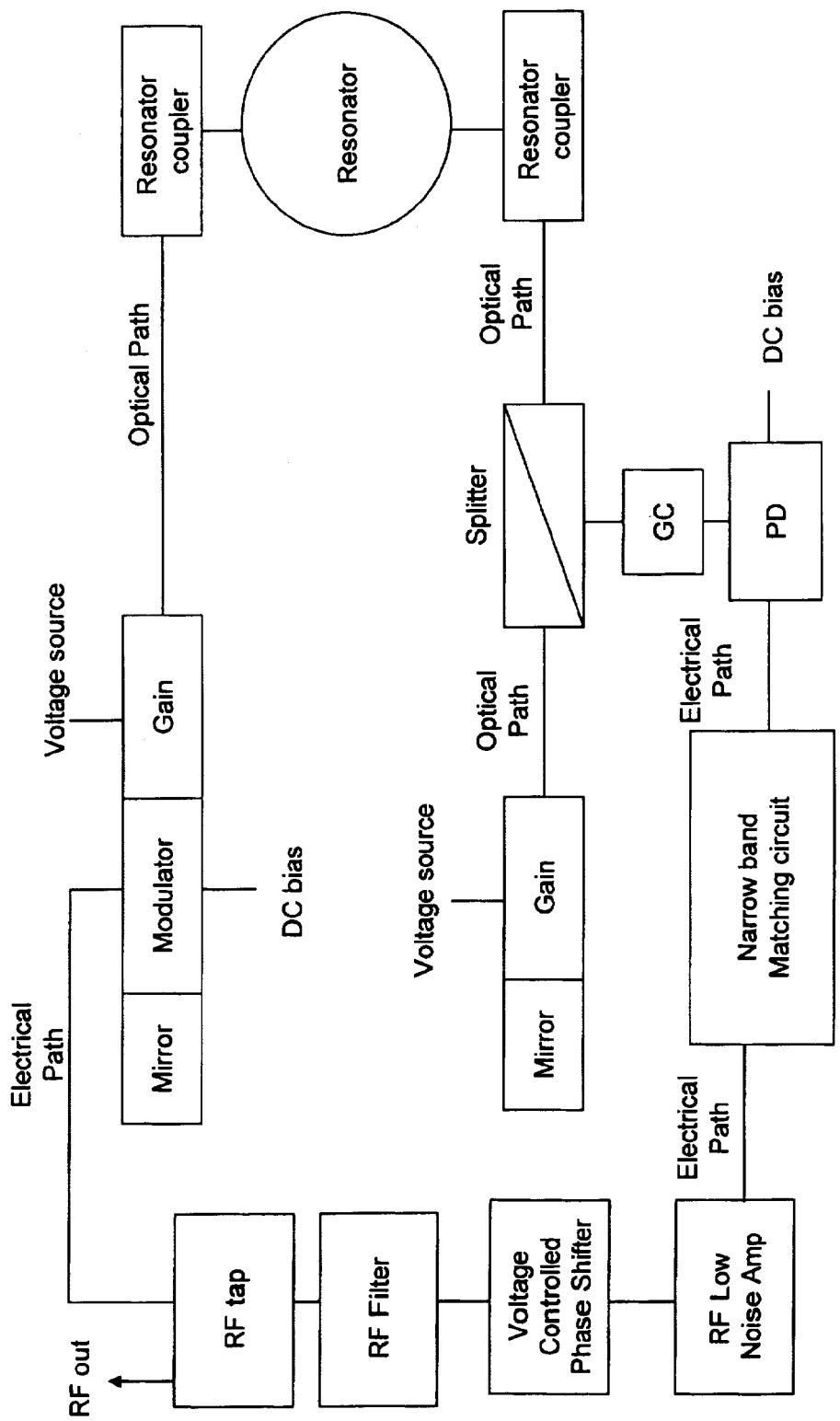
FIGS. 15A, 15B, 15C and 15D show examples of integrated OEOs with a separate fabricated micro resonator that is engaged to the OEO chip.

FIG. 15A shows an integrated COEO on a single chip where a Fabry-Perot type linear cavity similar to the COEO designs in FIGS. 2 and 3 is formed with two optical end mirrors to generate the laser light. One or more electrically excited optical gain media are used to produce the optical gain for the laser oscillation in the cavity. Different from the COEO designs in FIGS. 2 and 3, an optical splitter is inserted in the optical cavity to split a portion of the laser light for producing the optical output and the optical feedback as part of the opto-electronic loop. A grating coupler is used to split a portion of the split laser light from the optical splitter as an optical output of the COEO chip and direct the rest of the laser light to a photodetector (PD). The electrical part of the opto-electronic feedback loop may include a narrow band matching circuit, a low noise amplifier, a voltage controlled phase shifter, and a filter and operates to produce the modulation feedback control signal to the optical modulator in the optical cavity. The voltage controlled phase shifter is used to adjust the phase of the modulation control signal at the optical modulator to ensure the proper positive feedback for the oscillation. A signal tap is used to produce the electrical output for the COEO.

Figure 15B:
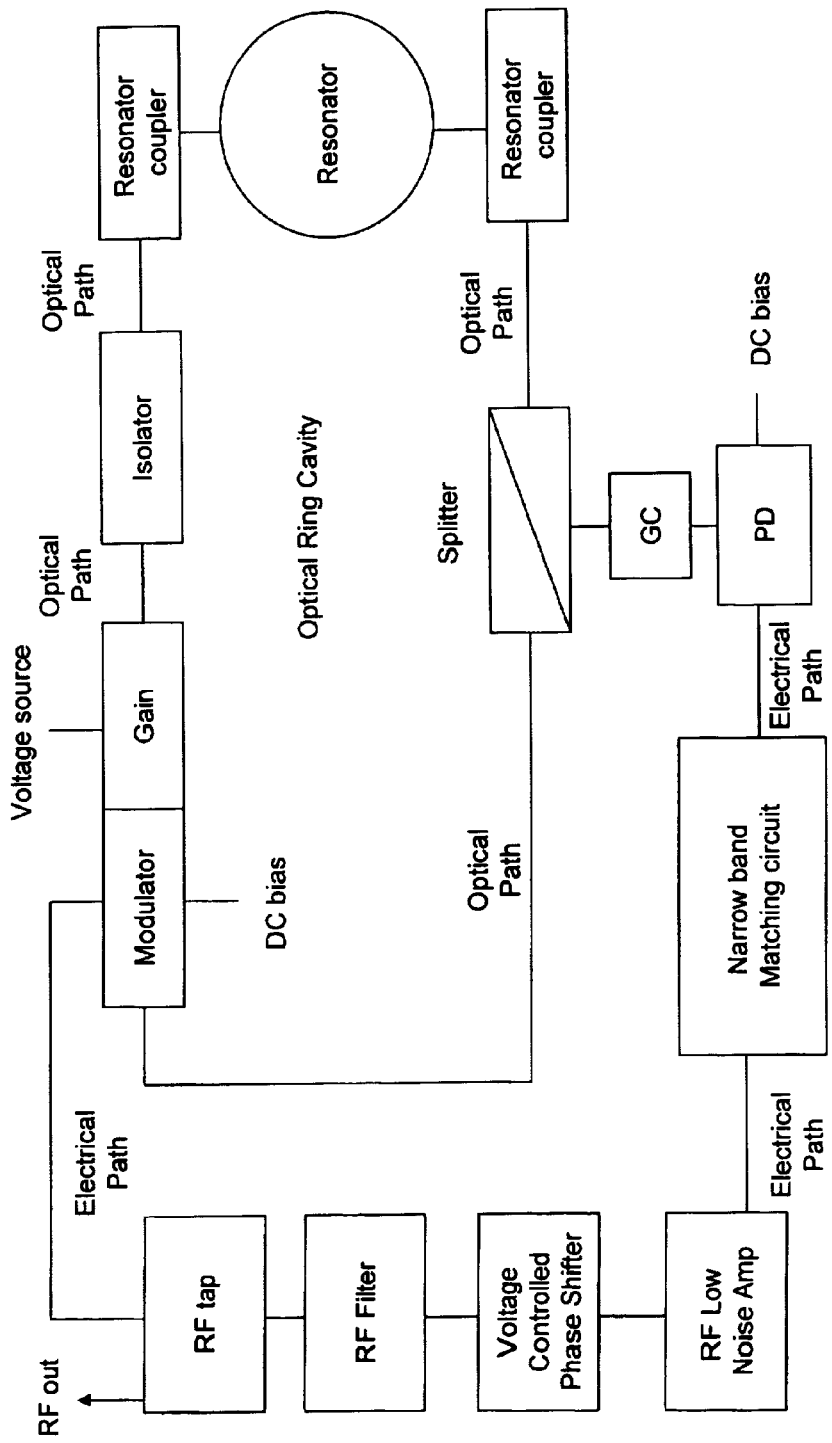

FIG. 15B shows an integrated ring-cavity COEO on a single chip where an optical ring cavity is used to generate the laser light. The ring cavity include the optical modulator, one or more electrically excited optical gain media, the microresonator and an optical splitter. The electrical section of the opto-electronic feedback loop may be similar to that of FIG. 15A.

Figure 15C:
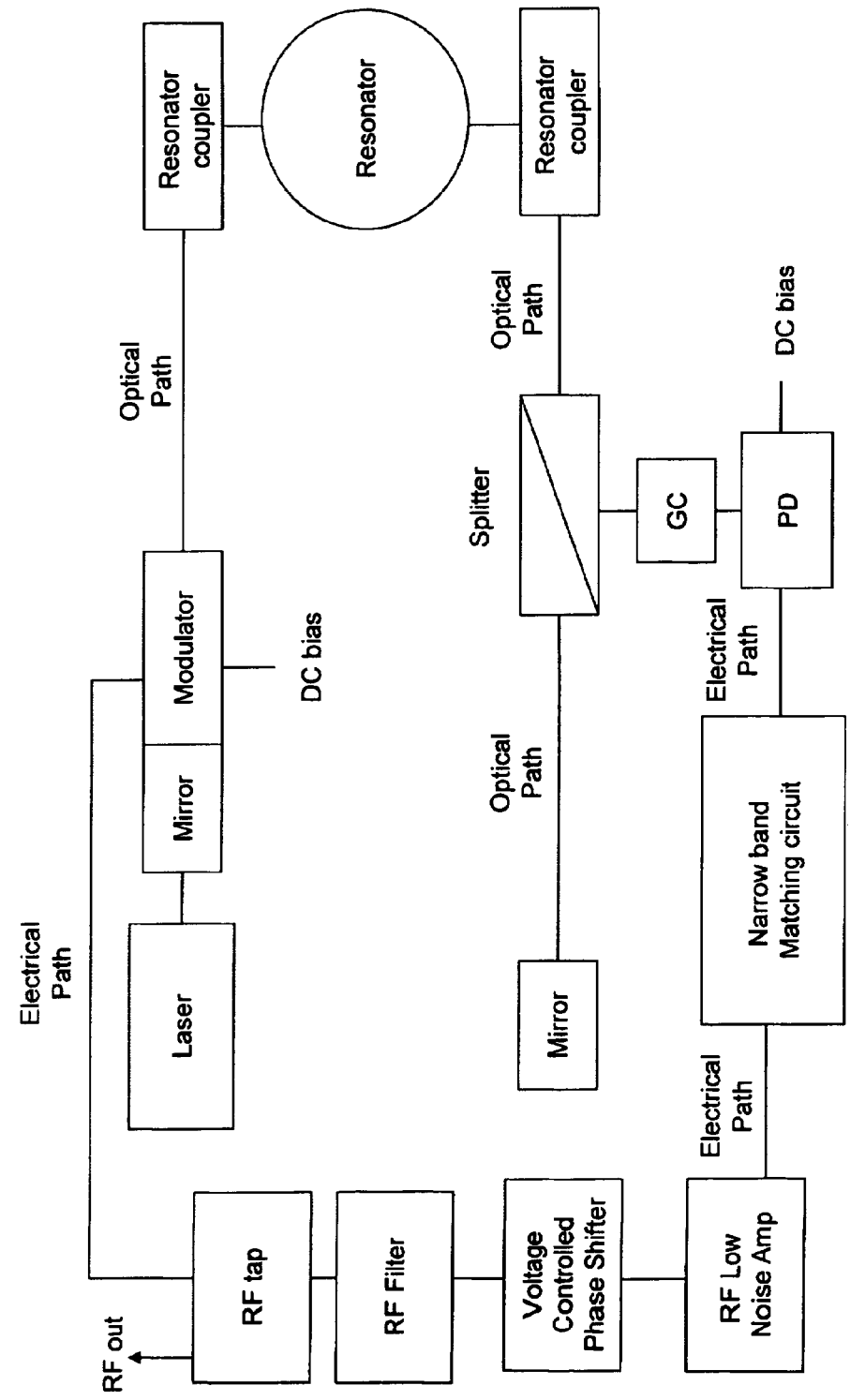

FIG. 15C shows an integrated OEO on a single chip where a laser and a separate optical linear cavity with the microresonator and the optical modulator are implemented. Two mirrors are used to define the optical linear cavity where one mirror is partially transmitting to receive the laser light from the laser. Once coupled into the linear cavity, the laser light is reflected back and forth within the linear cavity and is modulated by the optical modulator. In addition, the laser light in the linear cavity is coupled through the microresonator. Similar to the designs in FIGS. 15A and 15B, an optical splitter is inserted in the cavity to split a fraction of the laser light to a grating coupler for the optical output and for the optical feedback to the opto-electronic feedback loop.

Figure 15D:
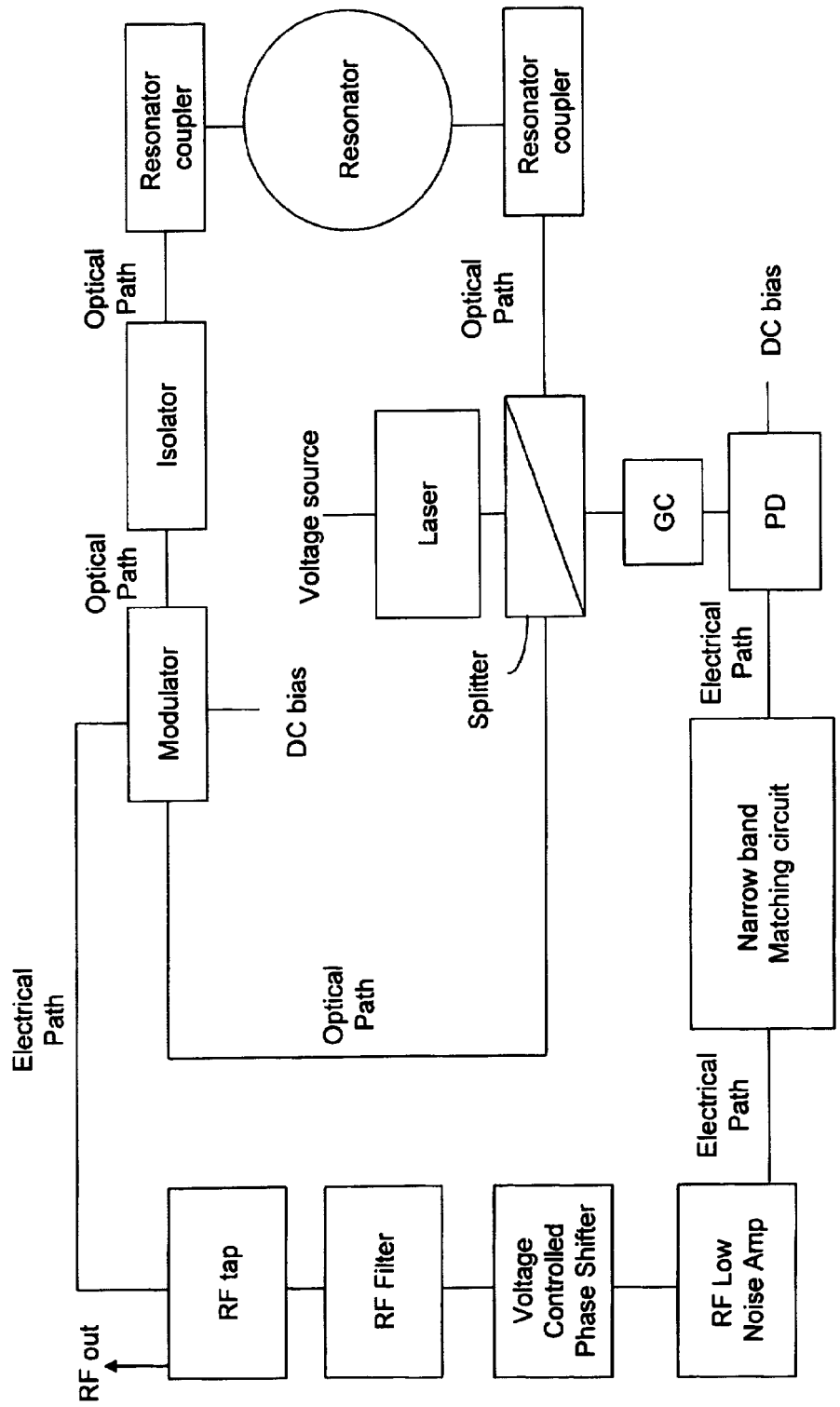

FIG. 15D shows an integrated ring-cavity OEO on a single chip where a ring with the microresonator and the optical modulator are implemented. A laser outside the ring cavity produces the laser light for the OEO. An optical coupler is used to couple the laser light from the laser in to the ring cavity. Once being coupled in the ring cavity, the laser light circulates in the ring cavity to transmit through the microresonator and is modulated by the optical modulator. A portion of the laser light in the ring cavity is coupled out of the ring by using the same optical coupler for coupling the laser light into the cavity to the grating coupler. Alternatively, a second separate optical coupler may be used to couple the laser light out of the ring cavity.

In the above examples of integrated OEOs, the microresonator is separately fabricated and is then engaged to the substrate on which the integrated OEO is formed. A number of methods have been described to engage the micro resonator to the OEO chip. In addition, the optical resonator may be fiber pigtailed and the other ends of the pigtailed fibers can be coupled to the waveguides on the OEO substrate using end facet coupling or grating-assisted surface coupling. In a fiber pigtailed resonator, a fiber may have an angled fiber end facet that is coupled to the optical resonator or a prism may be used as the optical coupler between the fiber and the optical resonator.

Some of the examples for the integrated OEOs described above use a grating coupler on the OEO substrate as an inter face to optically interface with an external fiber which may either receive output light from the OEO or supply light to the OEO. Alternatively, a waveguide on the OEO substrate may be optically coupled to an external fiber in an end facet coupling configuration where the end facet of the waveguide and the end facet of the fiber are either directly engaged to each other or indirectly engaged to each other via an optical coupling element between their end facets.

Micro fabrication techniques have been widely used to fabricate micro structures, such as MEMS devices, on substrates and may also be applied here to fabricate monolithic microresonator on a substrate for an integrated OEO.

Figure 16:
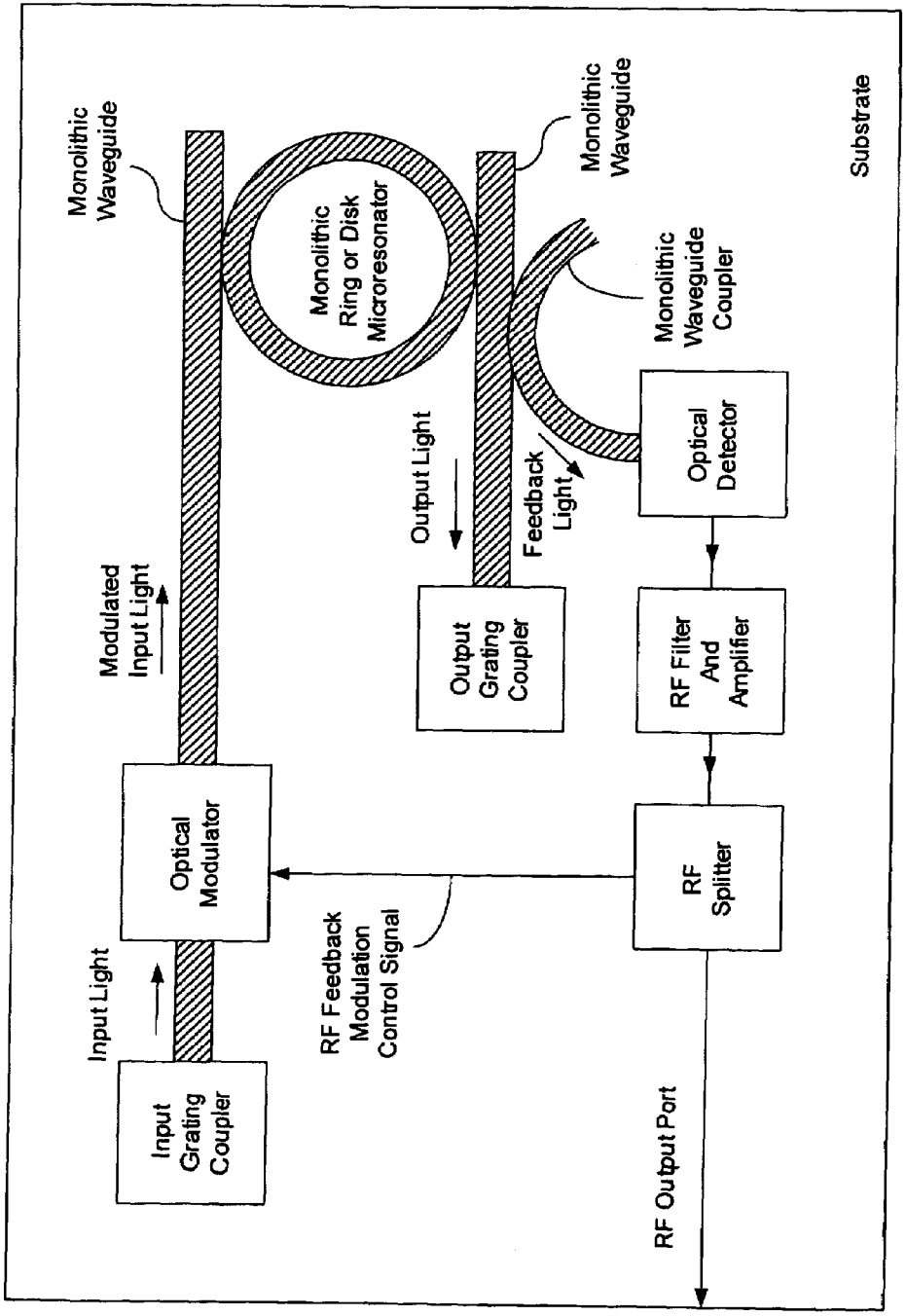
FIGS. 16, 17A, 17B, 17C and 17D show examples of integrated OEOs with a monolithically integrated micro resonator on the OEO chip.

FIG. 16 shows an example of an integrated OEO where all waveguides and the microresonator are monolithically fabricated on a single substrate. The microresonator may be a ring resonator formed by a waveguide in a closed circle or a disk microresonator. In some implementations, the width of the waveguides may be approximately at the submicron level. The waveguide ring as the ring resonator may also have a width from a submicron level and up. The diameter of the ring or disk cavity may be from about several hundreds of microns to several millimeters. When the ring resonators are implemented, the inner sidewall of the ring provides additional spatial confinement of the WG modes and this increases the spatial spread of the WG modes. This facilitates optical coupling with the ring resonator and may allow for direct optical coupling via the evanescent fields without the specially designed evanescent optical couplers. This spatial confinement by the inner wall of the ring also introduces optical propagation loss and thus reduced the quality factor. To decrease the optical loss, the inner diameter can be decreased to widen the width of the ring resonator. Hence, the specific geometry and design of a ring resonator represent a compromise between the optical loss and the ease of optical coupling.

The monolithic design avoids various technical issues associated with engaging the separate resonator to the chip in other designs described above. Since the waveguides and the resonator are formed of the same material, the coupling can be efficient when the surfaces of the resonator and the waveguides are sufficiently smooth. When the substrate is made of silicon, the RF circuitry of the OEO may also be integrated on the same substrate as illustrated. When silica is used to form the microresonator and the waveguides, at least one optical gain section may be formed in the resonator or the waveguides by doping with proper active ions (e.g., Er). A coupled OEO may be formed in such a design.

In the specific design in FIG. 16, an input grating coupler is used to receive an input laser beam from a laser off the OEO chip. An output grating coupler may be used to produce output light from the OEO. The laser may also be integrated on the integrated OEO with a monolithically integrated microresonator. FIGS. 17A through 17E show several examples.

Figure 17A:
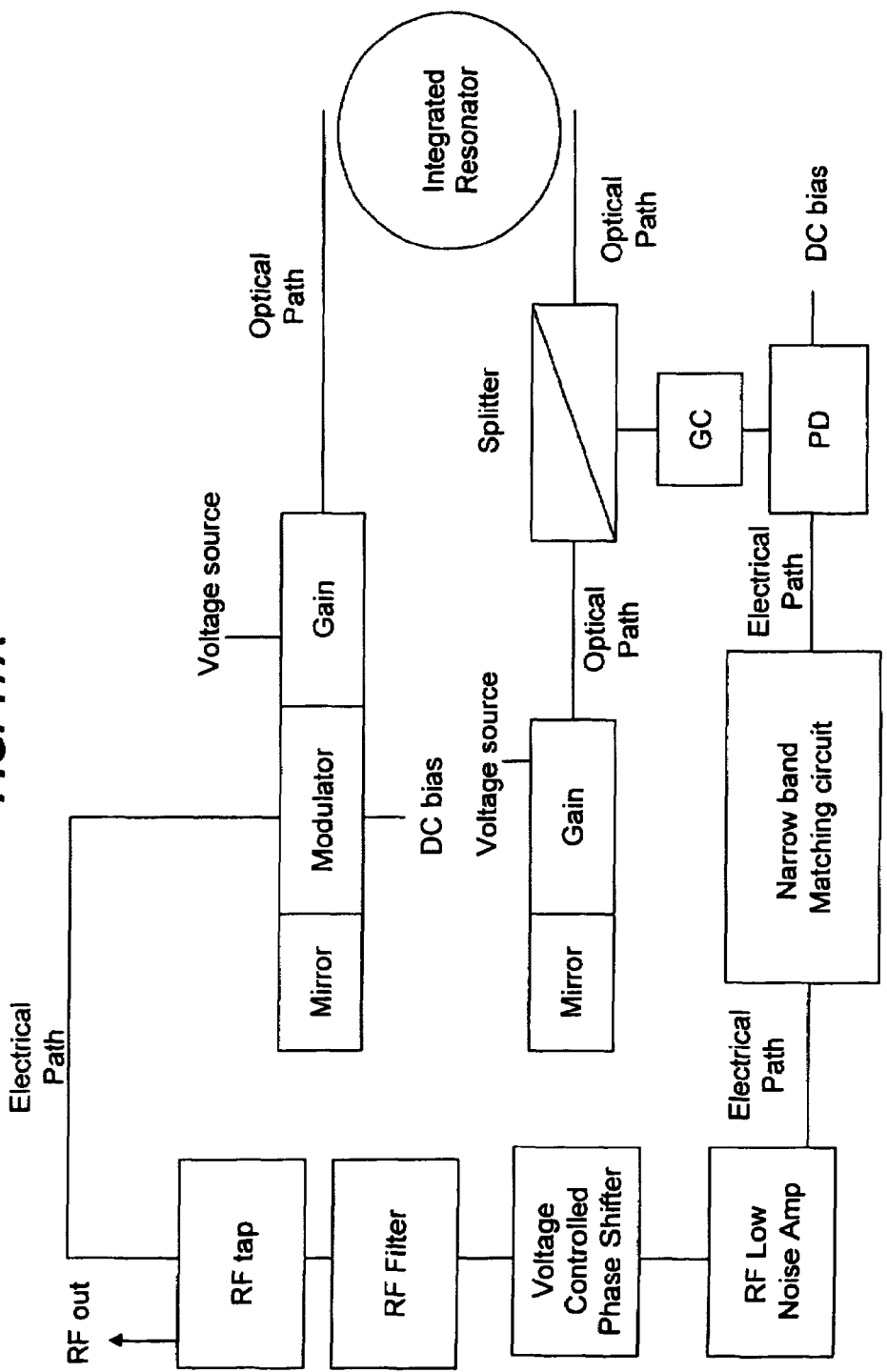
Figure 17B:
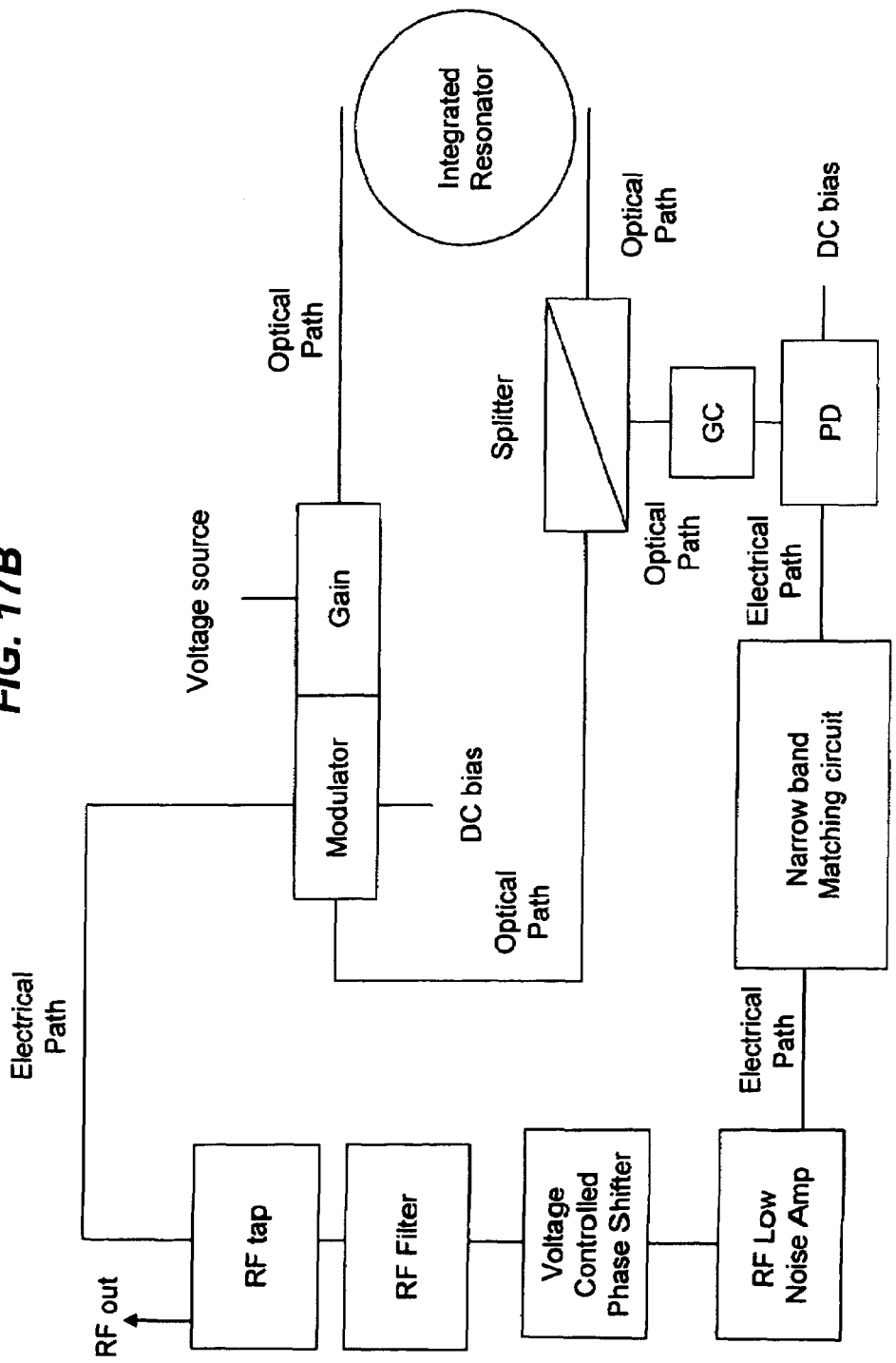
Figure 17C:
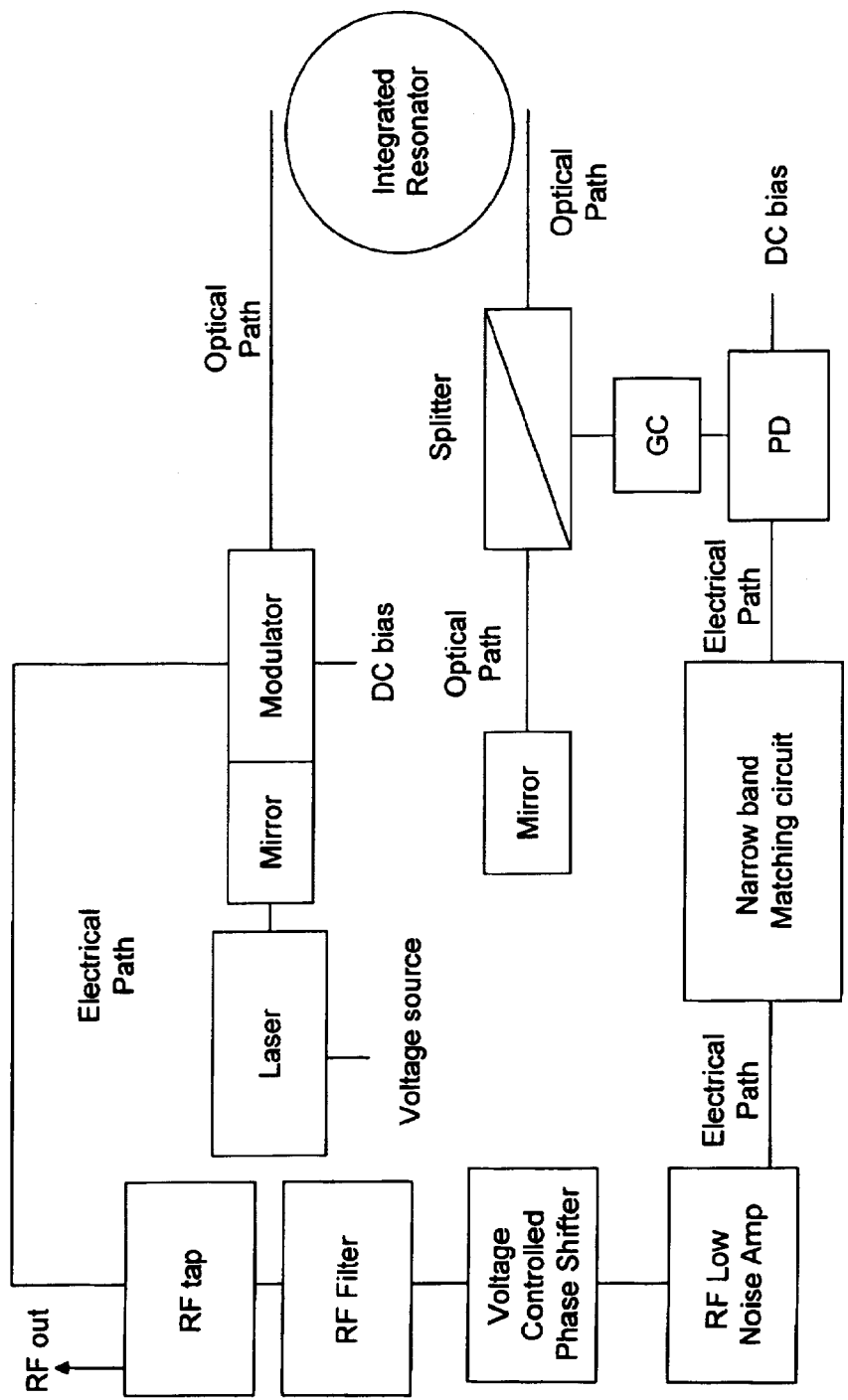
Figure 17D:
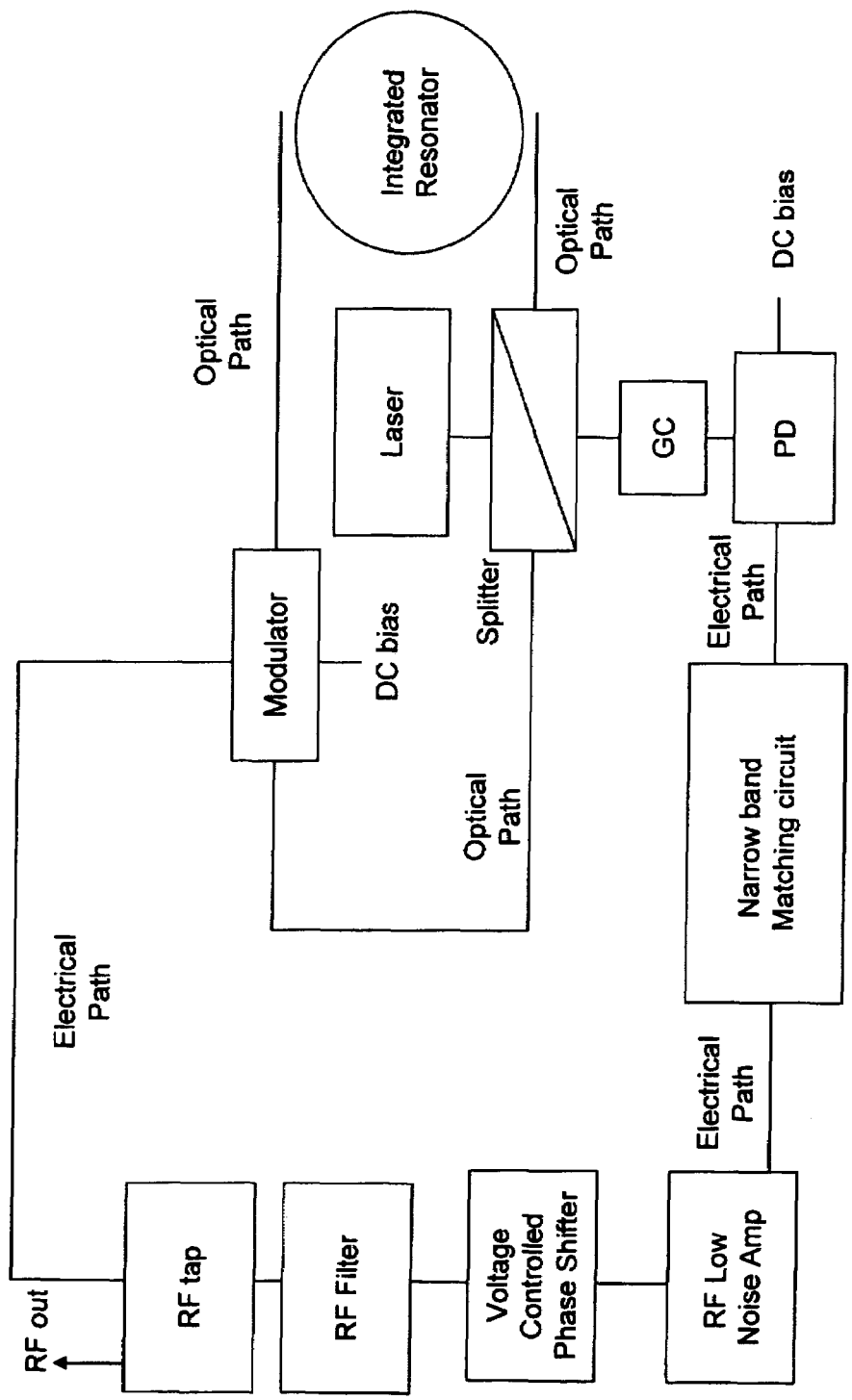

FIG. 17A shows an integrated COEO using a monolithically integrated microresonator based on the design in FIG. 15A where the linear cavity operates to produce the laser light on the chip. FIG. 17B shows an integrated COEO using a monolithically integrated microresonator based on the design in FIG. 15B where a ring cavity operates to produce the laser light on the chip. FIGS. 17C and 17D show integrated OEOs using monolithically integrated microresonators based on the designs in FIGS. 15C and 15D, respectively.

In the above examples for integrated OEOs, the microresonator may be formed of a material with a variable or tunable index of refraction that changes in response to a control signal. For example, an electro-optic material may be used to form the microresonator so that an electric field may be used to tune the resonance of the microresonator and to modulate the light in the microresonator. In some implementations, the microresonator exhibiting an electro-optic effect may be used for both the optical delay and the optical modulation by applying the RF modulation signal from the RF section of the OEO loop to the microresonator. Hence, a separate optical modulator can be eliminated.

Figure 18:
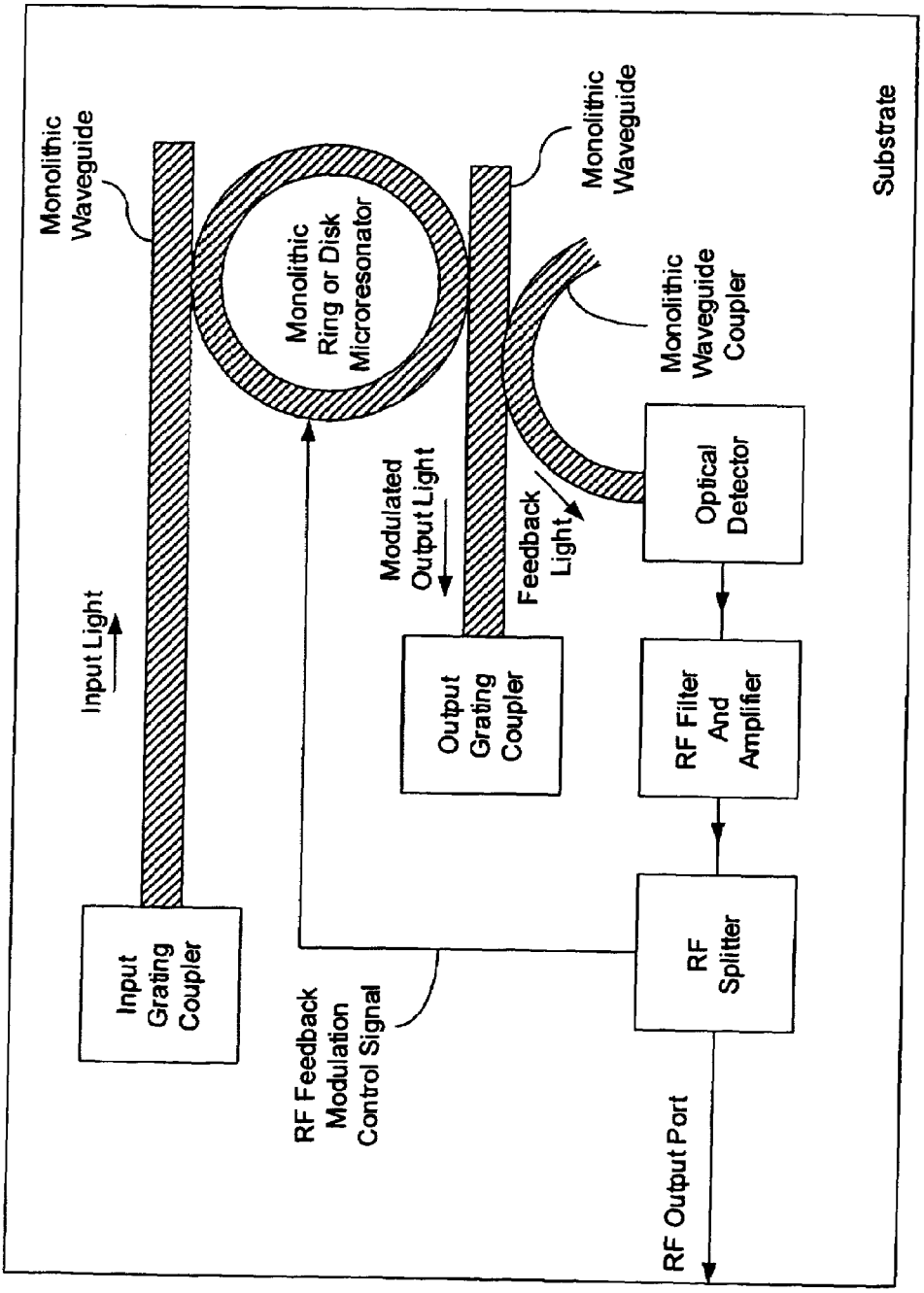
FIG. 18 shows an example of an integrated OEO where the micro resonator exhibits an electro-optic effect and is operated as an optical modulator and as an optical filter.

As an example, FIG. 18 shows an integrated OEO with a monolithically integrated electro-optic microresonator to replace the optical modulator and the microresonator in FIG.

16. The modulation control signal generated by the electrical section of the opto-electronic feedback loop is applied directly to microresonator to modulate the laser light. Such a monolithically integrated electro-optic microresonator may be used in other integrated OEOs and COEOs. In addition, integrated OEOs and COEOs with a microresonator that is separately fabricated and is engaged to the substrate may also use an electro-optic microresonator to eliminate the optical modulator such as the OEOs in FIGS. 4, 7, 8 and 17A through 17D.

Some implementations of optical modulation via electro-optic effect in a WGM resonator are described in U.S. Pat. No. 6,473,218 entitled "LIGHT MODULATION IN WHISPERING-GALLERY-MODE RESONATORS" which is incorporated herein by reference in its entirety as part of the specification of this application. Such an electro-optic light modulator may include a gallery-whispering-mode resonator partially or entirely formed of an electro-optical material, a first optical coupler to couple an input laser beam into the resonator, a second optical coupler to couple the optical energy out of the resonator to produce an optical output, and an electrical coupler to apply a driving electrical signal. The optical energy from the input laser beam is coupled to into the resonator in one of the whispering gallery modes. The applied electrical signal modulates the dielectric constant of the resonator and hence the mode of the whispering gallery modes. This modulates the intensity of the output from the second optical coupler. The basic features in the devices described in U.S. Pat. No. 6,473,218 may be applied to the microresonators for integrated OEOs of this application.

Figure 19A:
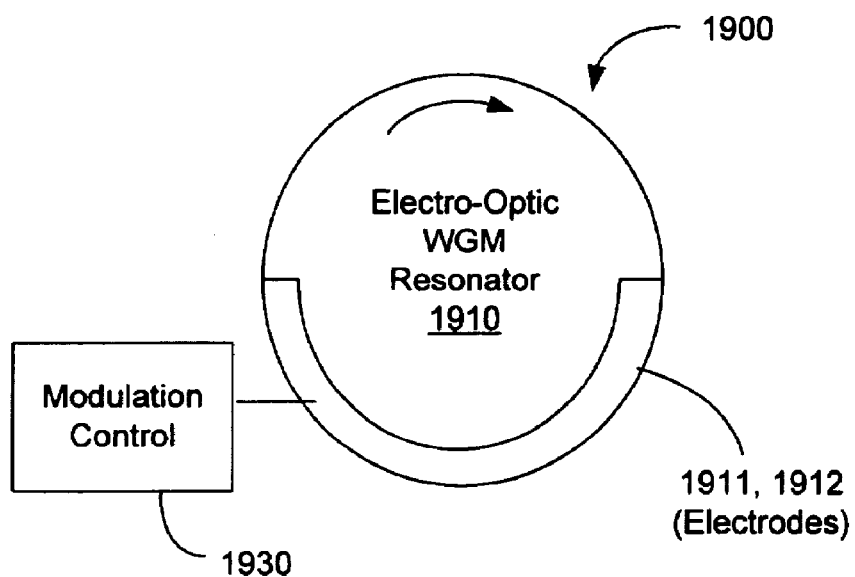
FIGS. 19A and 19B show an example of an electro-optic micro resonator for implementing the design in FIG. 18.
Figure 19B:
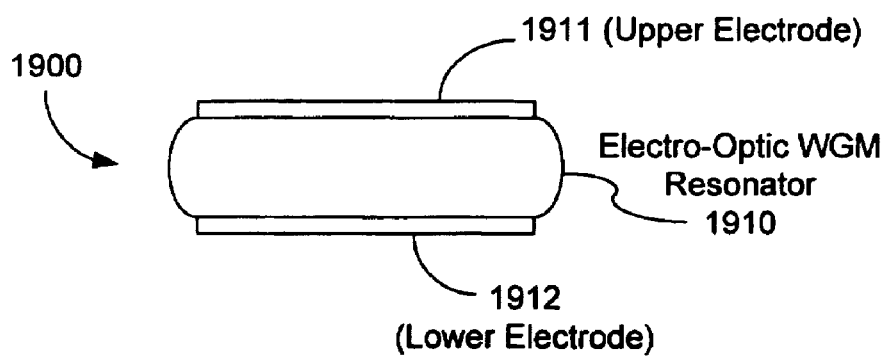

FIGS. 19A and 19B show an example of an electro-optic WGM resonator 1900 for optical modulation. A WGM resonator 1910 may use an electro-optic material to form the entire or part of the resonator 1910. The electro-optic material may be any suitable material, including an electro-optic crystal such as lithium niobate and semiconductor multiple quantum well structures. One or more electrodes 1911 and 1912 may be formed on the resonator 1910 to apply a control electrical field in at least the region where the WG modes are present to control the index of the electro-optical material. The electrodes 1911 and 1912 may form a RF resonator to support the electrical resonator mode in the same region of the resonator 1910 where the WG modes exist.

Assuming the resonator 1910 has disk or ring geometry, the electrode 1911 may be formed on the top of the resonator 1910 and the electrode 1912 may be formed on the bottom of the resonator 1910 as illustrated in the side view of the device in FIG. 19B. In one implementation, the electrodes 911 and 912 may be microstrip line electrodes. A modulation control unit 1930 such as a control circuit may be used to supply the electrical control signal to the electrodes 1911 and 1912. In the integrated OEOs of this application, the electrical portion of the opto-electronic feedback loop operates as the modulation control unit 1930. In operation, the control unit 1930 supplies a voltage as the electrical control signal to the electrodes 1911 and 1912. The modulation in the control voltage is transferred into the modulation in the refractive index of the resonator and the modulation of the resonance of the WG mode. For example, a Z-cut $LiNbO_3$ disk cavity with a diameter of d=4.8 mm and a thickness of 170 μm may be used as the resonator 1910. The cavity perimeter edge may be prepared in the toroidal shape with a 100 μm radius of curvature. As an alternative to the strip electrodes shown in FIG. 19A, the top and bottom surfaces of the disk resonator may be coated with conductive layers for receiving the external electrical control signal. A metal such as indium may be used to form the conductive coatings. Each conductive coating may be absent in the central part of the resonator and are present at the perimeter edge of the resonator where WGMs are localized. As another example, a monolithically integrated microresonator in a ring geometry where a waveguide forms a closed circle on the substrate may use an electro-optic material to form the waveguide ring.

In the above integrated OEOs, the light input to the oscillator (such as a laser) may be from an external laser off the OEO chip, or a laser on the OEO chip. The on-chip laser may be hybridly integrated onto the OEO chip by, e.g., flip-chip integration or monolithically fabricated on the OEO chip. In some implementations, a partial reflective structure may be placed before the photodetector in the OEO to form a closed optical cavity with the outside facet of the laser or other reflector on the input end. Other designs for providing light input to the OEO are also possible.

Only a few implementations are disclosed. However, it is understood that variations and enhancements may be made.

What is claimed is:

1. An opto-electronic device, comprising:
    a substrate;
    first and second waveguides formed on the substrate;
    a first grating coupler formed in the first waveguide to couple input light incident to the substrate into the first waveguide;
    an optical resonator in optical communication with the first and second waveguides to exchange light;
    an optical modulator coupled to the first waveguide and operable to modulate light in the first waveguide in response to an electrical modulation signal;
    a photodetector positioned on the substrate to receive and convert an optical output from the second waveguide into an electrical signal; and
    an electrical link coupled between the photodetector and the optical modulator to produce the electrical modulation signal from said electrical signal.

2. A device as in claim 1, wherein the optical resonator is a micro resonator in whispering gallery modes.

3. A device as in claim 2, wherein the micro resonator is monolithically formed on the substrate.

4. A device as in claim 2, wherein the micro resonator is engaged to the substrate.

5. A device as in claim 4, further comprising two fibers that are engaged between the micro resonator and the substrate to support the micro resonator above the substrate and provide the optical communication between the micro resonator and the first and second waveguides, respectively.

6. A device as in claim 4, further comprising two GRIN lenses that are engaged between the micro resonator and the substrate to support the micro resonator above the substrate and provide the optical communication between the micro resonator and the first and second waveguides, respectively.

7. A device as in claim 1, further comprising a second grating coupler coupled to the second waveguide to produce an optical output out of the substrate.

8. A device as in claim 1, further comprising an optical gain section in at least one of the first and the second waveguides to amplify light.

9. A device as in claim 1, wherein each waveguide comprises a multi-layer reflective stack as cladding.

10. A device as in claim 1, wherein each waveguide comprises a Bragg grating near the optical resonator to effectuate optical coupling with the optical resonator.

11. A device as in claim 1, wherein the optical resonator exhibits an electro-optic effect and is tunable in response to an applied electrical signal.

12. A device as in claim 1, further comprising a Si chip that is engaged to the substrate, wherein the electrical link comprises a CMOS circuit formed on the Si chip.

13. A device as in claim 1, wherein the electrical link comprises a voltage controlled phase shifter.

14. A device as in claim 1, wherein the substrate is silicon, the photodetector is a III-V semiconductor detector, and the electrical link comprises a CMOS circuit element.

15. A device as in claim 1, wherein the first and second waveguides, the optical resonator, and the optical modulator are optically linked to form an optical ring.

16. A device as in claim 1, wherein the electrical link is connected to a circuit off the substrate.

17. A device as in claim 1, wherein the optical resonator is evanescently coupled to the first waveguide at a first end facet of the first waveguide and to the second waveguide at a second end facet of the second waveguide.

18. A device as in claim 1, wherein the optical resonator is engaged to the substrate and the optical resonator is fiber pigtailed with two fibers which are coupled to the first and second waveguides.

* * * * *